(12) United States Patent
Iwasa et al.

(10) Patent No.: US 11,489,094 B2
(45) Date of Patent: Nov. 1, 2022

(54) LIGHT EMITTING DEVICE

(71) Applicant: NICHIA CORPORATION, Anan (JP)

(72) Inventors: Makiko Iwasa, Anan (JP); Yuji Sato, Anan (JP); Miyuki Kurata, Anan (JP)

(73) Assignee: NICHIA CORPORATION, Anan (JP)

( * ) Notice: Subject to any disclaimer, the term of this patent is extended or adjusted under 35 U.S.C. 154(b) by 243 days.

(21) Appl. No.: 17/031,403

(22) Filed: Sep. 24, 2020

(65) Prior Publication Data
US 2021/0098659 A1    Apr. 1, 2021

(30) Foreign Application Priority Data

Sep. 27, 2019  (JP) .............................. JP2019-177776

(51) Int. Cl.
*H01L 33/50* (2010.01)
*H01L 33/60* (2010.01)

(52) U.S. Cl.
CPC .......... *H01L 33/504* (2013.01); *H01L 33/507* (2013.01); *H01L 33/60* (2013.01)

(58) Field of Classification Search
CPC ... H01L 33/504; H01L 33/507; H01L 33/502; H01L 33/60
See application file for complete search history.

(56) References Cited

U.S. PATENT DOCUMENTS

| | | |
|---|---|---|
| 9,947,840 B2 | 4/2018 | Yuasa et al. |
| 10,243,113 B2 | 3/2019 | Suzuki et al. |
| 10,243,124 B2 | 3/2019 | Yuasa et al. |
| 10,319,889 B2 | 6/2019 | Yuasa et al. |
| 10,333,030 B2 | 6/2019 | Wakamatsu et al. |
| 2016/0003440 A1 | 1/2016 | Wataya et al. |
| 2018/0006197 A1 | 1/2018 | Yuasa et al. |
| 2018/0040775 A1 | 2/2018 | Wakamatsu et al. |
| 2018/0123000 A1 | 5/2018 | Suzuki et al. |
| 2018/0182941 A1 | 6/2018 | Yuasa et al. |
| 2018/0182942 A1 | 6/2018 | Yuasa et al. |

FOREIGN PATENT DOCUMENTS

| | | |
|---|---|---|
| JP | 2015-088220 A | 5/2015 |
| JP | 2018-006471 A | 1/2018 |
| JP | 2018-022844 A | 2/2018 |
| JP | 2018-078285 A | 5/2018 |
| JP | 2018-107417 A | 7/2018 |
| JP | 2018-107418 A | 7/2018 |

*Primary Examiner* — Sarah K Salerno
(74) *Attorney, Agent, or Firm* — Foley & Lardner LLP

(57) ABSTRACT

A light emitting device includes: a light emitting element having a light emission peak wavelength in a range of 380 nm or more and 485 nm or less; a wavelength conversion member including a fluorescent material layer disposed on a light emission side of the light emitting element and containing a fluorescent material having a reflectance to light having a wavelength of 450 nm of 10% or less and a light emission peak wavelength in a range of 610 nm or more and 780 nm or less, and a dielectric multilayer film disposed on a light emission side of the fluorescent material layer.

9 Claims, 13 Drawing Sheets

LIGHT EMITTING DEVICE

CROSS-REFERENCE TO RELATED PATENT APPLICATION

This application claims priority to Japanese Patent Application No. 2019-177776, filed on Sep. 27, 2019, the disclosure of which is hereby incorporated reference in its entirety.

BACKGROUND

The present disclosure relates to a light emitting device.

A light emitting device equipped with a light emitting diode (which may be hereinafter referred to as an "LED") and a wavelength converting member including a fluorescent material has been known. The light emitting device has been used, for example, as a light emitting device for a vehicle, such as a stop lamp and a rear lamp of a vehicle. In this specification, the term "fluorescent material" has the same meaning as the term "fluorescent phosphor".

For example, Japanese Patent Publication No. 2015-88220 describes a light emitting device for a vehicle used as a stop lamp or a rear lamp that includes an LED emitting blue light, and a fluorescent material that absorbs light radiated from the LED and emits light containing a red component.

SUMMARY

An object of certain embodiments of the present disclosure is to provide a light emitting device that is capable of reducing color unevenness caused by the change in directional angle.

A first embodiment of the present disclosure relates to a light emitting device including: a light emitting element having a light emission peak wavelength in a range of 380 nm or more and 485 nm or less, and a wavelength conversion member including a fluorescent material layer containing a fluorescent material having a reflectance to light having a wavelength of 450 nm of 10% or less and a light emission peak wavelength in a range of 610 nm or more and 780 nm or less, disposed on a light emission side of the light emitting element, and a dielectric multilayer film disposed on a light emission side of the fluorescent material layer. The light emitting device having a dominant wavelength in a range of 584 nm or more and 780 nm or less. The dielectric multilayer film having a reflection intensity in a range of 380 nm or more and 485 nm or less of 80% or more and a reflection intensity in a range of 610 nm or more and 780 nm or less of 10% or less in a reflection spectrum of the dielectric multilayer film at an incident angle of 0°, assuming that a maximum reflection intensity in a range of 380 nm or more and 780 nm or less in the reflection spectrum is 100%. The light emitting device having a wavelength difference ΔW of 20 nm or more between a wavelength Wr showing a reflection intensity of 50% in the reflection spectrum of the dielectric multilayer film and a wavelength Wf showing a light emission intensity of 50% on a short wavelength side of a maximum light emission peak in a light emission spectrum of the light emitting device assuming that a light emission intensity of the maximum light emission peak is 100%.

According to the present disclosure, a light emitting device that is capable of reducing color unevenness caused by the change in directional angle can be provided.

DETAILED DESCRIPTION

Figure 1A:
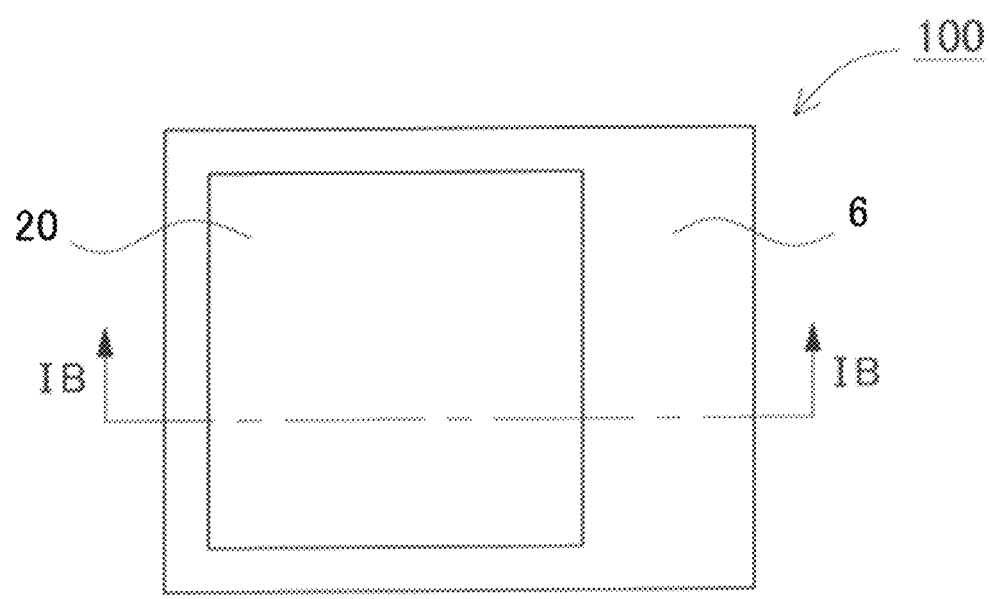
FIG. 1A is a schematic plane view of a light emitting device according to the first embodiment of the present disclosure.

Certain embodiments of the light emitting device according to the present invention will be described below. However, the embodiments described below are only examples for practicing the technical ideas of the present invention, and the present invention is not limited to the light emitting devices described below. The relationship between the color name and the chromaticity coordinate, and the relationship between the wavelength range of light and the color name of monochromic light are in accordance with JIS Z8110.

A rear lamp or a stop lamp is disposed at the corner of the rear end of a vehicle, and therefore a light emitting device for a vehicle is demanded to achieve light emission color that can be visually recognized not only from the front direction but also from various angular directions. Light emitted from an LED has characteristics such as high directionality and low diffusivity. A light emitting device including an LED has a reflection film that transmits light having been subjected to wavelength conversion by a fluorescent material and reflects light emitted from the LED, for providing light emission color suitable for the purpose. The reflection film used is a dielectric multilayer film having a structure of a distributed Bragg reflector (which may be hereinafter referred to as a "DBR") including plural laminated dielectric material layers having different refractive indices. Therefore, the light emitting device having the dielectric multilayer film may suffer color unevenness in some cases due to a mechanism in which the light that is reflected by the dielectric multilayer film in the case in which the light emission color is visually recognized in the light axis direction of the light emitting device, i.e., the normal direction perpendicular to the light emission surface of the light emitting device, is not reflected by the dielectric multilayer film but is transmitted through the dielectric multilayer film according to the viewing direction, and the chromaticity of the light emission color of the light emitting device is changed. In the description herein, the case in which the light emitting device is viewed in the normal direction, i.e., viewed in the direction in parallel to the light axis of the light emitting device, is designated as a directional angle of 0°, and the inclination angle from the directional angle of 0° in the horizontal direction to the light emission surface of the light emitting device is designated as a directional angle θ. The chromaticity of the light emission color of the directional angle may be referred to as "directional chromaticity" in some cases. A difference in the directional chromaticities of the directional angles may be referred to as "directional chromaticity characteristics" in some cases. The phrase "good directional chromaticity characteristics" refers to a condition in which the difference in the chromaticity of the light emission color depending on the change in directional angle is small, and the color unevenness caused by the change in directional angle can be reduced. The phrase "deteriorated directional chromaticity characteristics" refers to a condition in which the difference in the chromaticity of the light emission color depending on the change in directional angle is large, and the color unevenness occurs due to the change in directional angle.

Light Emitting Device

The light emitting device includes a light emitting element having a light emission peak wavelength in a range of 380 nm or more and 485 nm or less, and a wavelength conversion member including a fluorescent material layer containing a fluorescent material having a reflectance to light having a wavelength of 450 nm of 10% or less and a light emission peak wavelength in a range of 610 nm or more and 780 nm or less, disposed on the light emission side of the light emitting element, and a dielectric multilayer film disposed on the light emission side of the fluorescent material layer, and the light emitting device has a dominant wavelength in a range of 584 nm or more and 780 nm or less. The dielectric multilayer film has a reflection intensity in a range of 380 nm or more and 485 nm or less of 80% or more and a reflection intensity in a range of 610 nm or more and 780 nm or less of 10% or less in a reflection spectrum of the dielectric multilayer film at an incident angle of 0°, assuming that the maximum reflection intensity in a range of 380 nm or more and 780 nm or less in the reflection spectrum is 100%. The light emitting device has a wavelength difference $\Delta W$ of 20 nm or more between a wavelength Wr showing a reflection intensity of 50% in the reflection spectrum of the dielectric multilayer film and a wavelength Wf showing a light emission intensity of 50% on the short wavelength side of the maximum light emission peak in the light emission spectrum of the light emitting device assuming that the light emission intensity of the maximum light emission peak is 100%.

The light emitting device has a dominant wavelength in a range of 584 nm or more and 780 nm or less, and has a light emission color of amber color (yellowish red color) to red color. The term "dominant wavelength" means, in the CIE (Commission Internationale de l'Eclairage) 1931 chromaticity diagram, the wavelength at the intersection point of the spectrum locus and the extended line of the straight line connecting the chromaticity coordinate of white light (x=0.3333, y=0.3333) and the chromaticity coordinate (x,y) of the light emission color of the light emitting device.

The light emitting device includes the dielectric multilayer film that has a reflection intensity in a range of 380 nm or more and 485 nm or less of 80% or more and a reflection intensity in a range of 610 nm or more and 780 nm or less of 10% or less in a reflection spectrum of the dielectric multilayer film at an incident angle of 0°, assuming that the maximum reflection intensity in a range of 380 nm or more and 780 nm or less in the reflection spectrum is 100%. The angle of light that is incident on the surface of the dielectric multilayer film in the normal direction is referred to as an incident angle of 0°. The dielectric multilayer film can reflect blue light having a light emission peak wavelength in a range of 380 nm or more and 485 nm or less emitted from the light emitting element, and can transmit red light having a light emission spectrum in a range of 610 nm or more and 780 nm or less obtained through the wavelength conversion by the fluorescent material.

The reflection characteristics of the dielectric multilayer film have angle dependency. In the light emitting device having the dielectric multilayer film, at an directional angle of 0°, blue light having a light emission peak wavelength in a range of 380 nm or more and 485 nm or less emitted from the light emitting element is reflected by the dielectric multilayer film, and red light having a light emission spectrum in a range of 610 nm or more and 780 nm or less obtained through the wavelength conversion by the fluorescent material is transmitted therethrough. In the light emitting device having the dielectric multilayer film, due to the angle dependency of the dielectric multilayer film, a light emission color that is deviated in chromaticity from the light emission color at a directional angle of 0° is visually recognized at a directional angle of θ inclined from a directional angle of 0° in the horizontal direction to the light emission surface of the light emitting device. Accordingly, the light emitting device having the dielectric multilayer film may suffer color unevenness caused by the change in directional angle, and thus may have deteriorated directional chromaticity characteristics, in some cases. It is considered that one factor leading to the deterioration of the directional chromaticity characteristics of the light emitting device is that due to the angle dependency of the dielectric multilayer film, blue light emitted from the light emitting element is not reflected by the dielectric multilayer film but is transmitted therethrough by the change in directional angle. Furthermore, it is considered that another factor leading to the deterioration of the directional chromaticity characteristics of the light emitting device is that light obtained through the wavelength conversion by the fluorescent material, which is to be transmitted, is also reflected by the dielectric multilayer film, and the reflected light escapes by the change in directional angle and changes the chromaticity of the light emission color. The present inventors have found that the color unevenness caused by the change in directional angle can be reduced by reducing the overlap of the wavelength range where the reflection intensity is decreased, i.e., the dielectric multilayer film transmits light, in the reflection spectrum of the dielectric multilayer film at an incident angle of 0° and the wavelength range where the light emission intensity is increased in the light emission spectrum of the light emitting device, and thus the directional chromaticity characteristics of the light emitting device can be improved.

The light emitting device has a wavelength difference ΔW of 20 nm or more between a wavelength Wr showing a reflection intensity of 50% in the reflection spectrum of the dielectric multilayer film at an incident angle of 0° assuming that the maximum reflection intensity in a range of 380 nm or more and 780 nm or less in the reflection spectrum is 100% and a wavelength Wf showing a light emission intensity of 50% on the short wavelength side of the maximum light emission peak in the light emission spectrum of the light emitting device assuming that the light emission intensity of the maximum light emission peak is 100%. In the case in which the wavelength difference ΔW is 20 nm or more, the overlap range of the wavelength range where the reflection intensity is decreased in the reflection spectrum of the dielectric multilayer film and the wavelength range where the light emission intensity is increased in the light emission spectrum of the light emitting device can be reduced, and the light emitted from the light emitting element can be prevented from escaping from the dielectric multilayer film even though the directional angle is changed, thereby reducing the color unevenness caused by the change in directional angle. In the case in which the wavelength difference ΔW is 20 nm or more, the overlap range of the wavelength range where the reflection intensity is decreased in the reflection spectrum of the dielectric multilayer film and the wavelength range where the light emission intensity is increased in the light emission spectrum of the light emitting device can be reduced, and the light subjected to the wavelength conversion by the fluorescent material to be transmitted can be prevented from being reflected by the dielectric multilayer film. In the case in which the wavelength difference ΔW is 20 nm or more, the light reflected by the dielectric multilayer film can be prevented from escaping from the light emitting device by the change in directional angle, and the directional chromaticity characteristics of the light emitting device can be improved. The wavelength difference ΔW is preferably 30 nm or more, and more preferably in a range of 40 nm or more and 150 nm or less. The wavelength difference ΔW is preferably larger, but too large a wavelength difference ΔW may cause deviation from the wavelength range of the target light emission color in some cases. Accordingly, the wavelength difference ΔW is preferably in a range of 40 nm or more and 150 nm or less in relation to the wavelength range of the light reflected by the dielectric multilayer film and the wavelength range of the light emitted from the light emitting device.

In the case in which the light emitting device has a wavelength difference ΔW of 20 nm or more, the light emitting device can emit light that has an absolute value of a difference Δx of the x coordinate of 0.010 or less between an x coordinate $x_0$ of a light emission color of the light emitting device at a directional angle of 0° and an x coordinate $x_{60}$ of a light emission color of the light emitting device at a directional angle of 60° in the CIE 1931 chromaticity diagram. In the case in which the absolute value of the difference Δx of the x coordinate between a directional angle of 0° and a directional angle of 60° is 0.010 or less, the chromaticity of the light emission color of the light emitting device is substantially not changed even though the directional angle is changed, and the color unevenness caused by the change in directional angle can be reduced to improve the directional chromaticity characteristics. The absolute value of the difference Δx of the x coordinate is more preferably 0.009 or less, further preferably 0.008 or less, still further preferably 0.007 or less, and particularly preferably 0.006 or less.

Figure 1B:
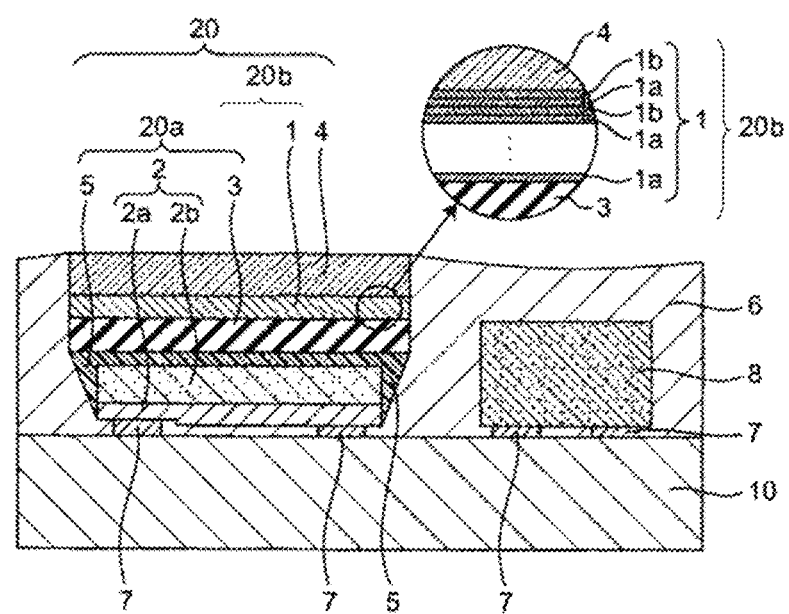
FIG. 1B is a schematic cross sectional view of a light emitting device according to the first embodiment of the present disclosure.

One example of the light emitting device according to one embodiment of the present disclosure will be described with reference to the drawings. FIG. 1A is a schematic plane view of a light emitting device 100 of one embodiment of the present disclosure, and FIG. 1B is a schematic cross sectional view of the light emitting device 100.

The light emitting device 100 includes a light emission laminated part 20 having a light emission surface of the light emitting device 100, and a covering member 6.

The light emission laminated part 20 is provided on a substrate 10, and includes a light emitting part 20a including a light emitting element 2 and a fluorescent material layer 3, and a dielectric multilayer film 1. A wavelength conversion member 20b includes the fluorescent material layer 3 and the dielectric multilayer film 1. A translucent member 4 may be provided on the light emission side of the dielectric multilayer film 1. The translucent member 4 is preferably disposed in contact with the light emission side of the dielectric multilayer film 1 for emitting light with high efficiency from the dielectric multilayer film 1 to the outside through the translucent member 4.

The light emission laminated part 20 is covered with the covering member 6 on the substrate 10 except for the surface of the translucent member 4, which is the light emission surface. The side surfaces of the light emitting part 20a including the light emitting element 2 and the fluorescent material layer 3 are covered with the covering member 6 that substantially entirely reflects, for example, visible light, and the surface thereof opposite to the light emitting element 2 is covered with the dielectric multilayer film 1 that transmits the light emitted from the fluorescent material contained in the fluorescent material layer 3 and reflects the light emitted from the light emitting element 2. According to the structure, the light emitting device 100 emits light having a light emission spectrum that is substantially equivalent to the light having a light emission peak wavelength in a range of 610 nm and 780 nm or less emitted by the fluorescent material. The covering member 6 reflects both the light emitted from the light emitting element 2 and the light emitted from the fluorescent material contained in the fluorescent material layer 3.

The light emitting element 2 is provided on the substrate 10 via a conductive bonding member 7, and emits light having a light emission peak wavelength in a range of 380 nm or more and 485 nm or less by applying a voltage via wiring provided on the substrate 10.

The fluorescent material layer 3 is provided on the light emission surface of the light emitting element 2, excited by the light emitted from the light emitting element 2, and emits light having a light emission peak wavelength in a range of 610 nm or more and 780 nm or less through wavelength conversion by the fluorescent material contained in the fluorescent material layer 3. In the present disclosure, the expression "an article is provided on a member A", for example, "a layer is provided on a light emission surface of a light emitting element 2", encompasses the case in which an article is provided in contact with a member A, and the case in which an article is provided on a member A via another layer. The fluorescent material layer 3 is provided on the light emission surface of the light emitting element 2 via an adhesive layer 5.

The dielectric multilayer film 1 is provided on the fluorescent material layer 3, and has a function of reflecting the light emitted from the light emitting element 2 and transmitting the light emitted from the fluorescent material layer 3. The dielectric multilayer film 1 specifically has a function of reflecting the light having a light emission peak wavelength in a range of 380 nm or more and 485 nm or less emitted from the light emitting element 2 and transmitting the light having a light emission peak wavelength in a range of 610 nm or more and 780 nm or less emitted from the fluorescent material contained in the fluorescent material layer 3. The dielectric multilayer film 1 may be constituted, for example, by a multilayer film including a first dielectric material layer 1a and a second dielectric material layer 1b having refractive indices different from each other, which are laminated alternately. The dielectric multilayer film 1 can be configured to reflect the light emitted from the light emitting element 2 and to transmit the light emitted from the fluorescent material contained in the fluorescent material layer 3, by setting the thicknesses of the first dielectric material layers 1a and the second dielectric material layers 1b, based on the light emission spectrum (i.e., the center wavelength and the intensity distribution with respect to the wavelength) of the light emitted from the light emitting element 2, the first refractive index of the first dielectric material layer 1a, and the second refractive index of the second dielectric material layer 1b.

The light emitting device 100 may include a semiconductor element 8, such as a protection element for protecting the light emitting element 2 against breakage due to the application of an excessive voltage. In the case in which the semiconductor element 8 is included, the covering member 6 may be provided, for example, to cover the semiconductor element 8. The semiconductor element 8 referred herein does not encompass a light emitting element.

In the light emitting device 100 having the aforementioned structure, the light emitting part 20a including the light emitting element 2 and the fluorescent material layer 3 is covered with the covering member 6 reflecting both the light emitted from the light emitting element 2 and the light emitted from the fluorescent material layer 3, and with the dielectric multilayer film 1 reflecting the light emitted from the light emitting element 2 and transmitting the light emitted from the fluorescent material layer 3. According to the structure, the light emitting device 100 emits light having a light emission spectrum that is substantially equivalent to the light emission spectrum of the light emitted from the fluorescent material layer 3.

The light emitting device emits light having a dominant wavelength in a range of 584 nm or more and 780 nm or less in such a manner that the fluorescent material contained in the fluorescent material layer 3 having a light emission peak wavelength in a range of 610 nm or more and 780 nm or more is excited by the light having a light emission peak wavelength in a range of 380 nm or more and 485 nm or less emitted from the light emitting element 2. In the case in which the dominant wavelength of the light emitted from the light emitting device 100 is in a range of 584 nm or more and 780 nm or less, light of amber color (yellowish red color) to red color is emitted, which can be favorably applied to a light emitting device for a vehicle, such as a stop lamp and a rear lamp of a vehicle.

The light emitting device may emit light in a region that is demarcated by a first straight line connecting a first point and a second point, a second straight line connecting a second point and a third point, a third straight line connecting a third point and a fourth point, and a fourth straight line connecting a fourth point and a first point, wherein in an xy chromaticity coordinate system of the CIE 1931 chromaticity diagram, the chromaticity coordinate (x,y) is (x=0.522, y=0.449) for the first point, (x=0.538, y=0.461) for the second point, (x=0.735, y=0.265) for the third point, and (x=0.721, y=0.259) for the fourth point. The region that is demarcated by the first straight line, the second straight line, the third straight line, and the fourth straight line may be referred to as a target color tone range. The light emission color of the light emitting device may have a chromaticity coordinate (x,y) that exists in the target color tone range, and therefore the light emitting device can emit light of amber color (yellowish red color) to red color.

In the light emission spectrum of the light emitting device, the light emission peak intensity Ie of the light emitting element is preferably 1/35 or less with respect to the light emission intensity Im of the maximum light emission peak of the light emitting device. In the light emission spectrum of the light emitting device, in the case in which the intensity ratio Ie/Im of the light emission peak intensity Ie of the light emitting element and the light emission intensity Im of the maximum light emission peak of the light emitting device is 1/35 or less, the color unevenness caused by the change in directional angle can be reduced, and light having improved directional chromaticity characteristics can be emitted. In the light emission spectrum of the light emitting device, the intensity ratio Ie/Im of the light emission peak intensity Ie of the light emitting element and the light emission intensity Im of the maximum light emission peak of the light emitting device is more preferably 0.0285 or less, further preferably 0.020 or less, still further preferably 0.015 or less, particularly preferably 0.010 or less, and most preferably 0. The intensity ratio Ie/Im may be 1/1000 (0.001) or more.

The members constituting the light emitting device 100 will be described below.

Substrate 10

The substrate 10 preferably has an insulating property and is preferably difficult to transmit light. Examples of the material for the substrate 10 include ceramics, such as alumina and aluminum nitride, and resins, such as a phenol resin, an epoxy resin, a polyimide resin, a BT resin, and a polyphthalamide. Among these, ceramics are preferred due to the high thermal radiation capability thereof. In the case in which a resin is used, an inorganic filler, such as glass fibers, silicon oxide, titanium oxide, and alumina, may be mixed with the resin depending on necessity, thereby achieving the enhancement of the mechanical strength, the reduction of the thermal expansion ratio, and the enhancement of the light reflectance.

Light Emitting Element 2

The light emitting element 2 is for exciting the fluorescent material contained in the fluorescent material layer 3. Preferred examples of the light emitting element 2 used include a light emitting diode (LED) chip and a laser diode (LD) chip, and an LED chip is preferably used. The use of a light emitting diode chip as the light emitting element 2 facilitates the broadening of the light emitted from the light emitting element 2, and thereby the fluorescent material contained in the fluorescent material layer 3 can be excited by high efficiency. The light emitting element 2 has a light emission peak wavelength in a range of 380 nm or more and 485 nm or less, preferably has a light emission peak wavelength in a range of 390 nm or more and 480 nm or less, more preferably has a light emission peak wavelength in a range of 400 nm or more and 475 nm or less, and particularly preferably has a light emission peak wavelength in a range of 420 nm or more and 470 nm or less, and emits light having a large amount of a blue component.

The light emitting element 2 used may be, for example, a semiconductor light emitting element using a nitride semiconductor represented by the formula $In_XAl_YGa_{1-X-Y}N$ (wherein $0 \leq X$, $0 \leq Y$, and $X+Y \leq 1$).

The light emitting element 2 has a semiconductor laminate 2a equipped with a p-electrode and an n-electrode. The light emitting element 2 may have the p-electrode and the n-electrode that may be provided on the same side of the light emitting element 2, and the light emitting element 2 may be mounted on the substrate 10 by a flip chip method.

Fluorescent Material Layer 3

The fluorescent material layer 3 absorbs the light emitted from the light emitting element 2 to convert the wavelength thereof to a different range, and emits the light having been subjected to the wavelength conversion. The fluorescent material layer 3 may be formed, for example, by printing a composition for forming a fluorescent material layer containing fluorescent material particles and a translucent binder on the surface of the translucent member 4 via the dielectric multilayer film 1.

The thickness of the fluorescent material layer 3 is preferably in a range of 30 μm or more and 150 μm or less, more preferably in a range of 40 μm or more and 140 μm or less, and further preferably in a range of 50 μm or more and 130 μm or less. In the case in which the thickness of the fluorescent material layer 3 is in a range of 30 μm or more and 150 μm or less, a light emitting device that has the target light emission intensity and has a light emission color within the target color tone range in the CIE 1931 chromaticity diagram can be obtained.

In the case in which the fluorescent material layer 3 is formed with the composition for forming a fluorescent material layer, the amount of the fluorescent material particles contained in the composition for forming a fluorescent material layer is preferably in a range of 20 parts by mass or more and 280 parts by mass or less, and more preferably in a range of 50 parts by mass or more and 250 parts by mass or less, per 100 parts by mass of the binder. In the case in which the amount of the fluorescent material particles contained in the composition for forming the fluorescent material layer 3 is in a range of 20 parts by mass or more and 280 parts by mass or less per 100 parts by mass of the binder, a fluorescent material layer 3 that has the target light emission intensity and has a light emission color within the target color tone range in the CIE 1931 chromaticity diagram can be obtained.

Fluorescent Material

The fluorescent material contained in the fluorescent material layer 3 has a reflectance to light having a wavelength of 450 nm of 10% or less and a light emission peak wavelength in a range of 610 nm or more and 780 nm or less. In the case in which the reflectance to light having a wavelength of 450 nm of the fluorescent material contained in the fluorescent material layer 3 is 10% or less, the fluorescent material can efficiently perform the wavelength conversion of the light emitted from the light emitting element 2 and the light emitted from the light emitting element 2 and reflected by the dielectric multilayer film 1, and the light subjected to the wavelength conversion by the fluorescent material is made to transmit through the dielectric multilayer film 1, providing a light emission color within the target color tone range suppressed in color unevenness caused by the change in directional angle. In the case in which the reflectance to light having a wavelength of 450 nm of the fluorescent material contained in the fluorescent material layer 3 exceeds 10%, the light emitted from the light emitting element 2 tends to escape from the dielectric multilayer film 1, and the color unevenness may be caused by the change in directional angle in some cases. The reflectance to light having a wavelength of 450 nm of the fluorescent material contained in the fluorescent material layer 3 is preferably 9% or less, more preferably 8% or less, and particularly preferably 7% or less. The reflectance to light having a wavelength of 450 nm of the fluorescent material contained in the fluorescent material layer 3 is preferably as small as possible since the wavelength conversion of the light emitted from the light emitting element 2 can be performed with high efficiency. The reflectance to light having a wavelength of 450 nm of the fluorescent material contained in the fluorescent material layer 3 may be 0%, and may also be 0.5% or more.

The average particle diameter of the fluorescent material is preferably in a range of 2 μm or more and 40 μm or less, more preferably in a range of 10 μm or more and 40 μm or less, and further preferably in a range of 15 μm or more and 40 μm or less. In the case in which the particle diameter of the fluorescent material particles is large, the extraction efficiency of light may be increased due to the decrease of the scattering thereof, but the amount of light that is not subjected to the wavelength conversion is increased since the amount of light that is emitted by the fluorescent material is decreased due to the small surface area of the particles. The light that is not subjected to the wavelength conversion is returned to the side of the fluorescent material layer 3 by the dielectric multilayer film 1, and therefore the increase of the particle diameter of the fluorescent material particles can achieve the wavelength conversion of the light emitted from the light emitting element 2 with high efficiency while suppressing the scattering on the surface of the particles. Therefore, with a larger particle diameter of the fluorescent material particles, the light emitted from the light emitting element 2 can be efficiently subjected to the wavelength conversion, and the light extraction efficiency can be enhanced. In the case in which the fluorescent material particles are too large, on the other hand, the handleability thereof may be deteriorated. The average particle diameter of the fluorescent material particles may be measured by a Fisher sub-sieve sizer method (which may be hereinafter referred to as an "FSSS method"). The FSSS method is a one kind of the air permeability method, and is a method of measuring the specific surface area utilizing the flow resistance of air, so as to obtain mainly the particle diameter of primary particles. The average particle diameter measured by the FSSS method is the Fisher sub-sieve sizer's number.

First Nitride Fluorescent Material

The fluorescent material contained in the fluorescent material layer 3 will be described below. The fluorescent material layer 3 preferably contains a first nitride fluorescent material having a composition containing Ca, Eu, Si, Al, N, and depending on necessity Sr, and having a molar ratio of Eu of 0.01 or more and 0.04 or less, a molar ratio of Si of 0.8 or more and 1.2 or less, and a molar ratio of N of 2.5 or more and 3.5 or less, per 1 mol of the composition. The first nitride fluorescent material has a light emission peak wavelength in a range of 610 nm or more and 780 nm or less. In the case in which the fluorescent material layer 3 contains the first nitride fluorescent material, the light emitting device can emit light having a dominant wavelength in a range of 584 nm or more and 780 nm or less. In the case in which the fluorescent material layer 3 contains the first nitride fluorescent material, a light emitting device that has the target light emission intensity and has a light emission color within the target color tone range in the CIE 1931 chromaticity diagram can be obtained.

The first nitride fluorescent material preferably has a composition represented by the following formula (I):

$$Sr_tCa_vEu_wAl_xSi_yN_z \qquad (I)$$

wherein in the formula (I), t, v, w, x, y, and z satisfy $0 \leq t<1$, $0<v<1$, $0.01<w\leq 0.04$, $t+v+w<1$, $0.80\leq x \leq 1.2$, $0.80\leq y \leq 1.2$, and $2.5\leq z \leq 3.5$.

Second Nitride Fluorescent Material

The fluorescent material layer 3 may contain a second nitride fluorescent material having a composition containing Ca, Si, Eu, N, and depending on necessity at least one of Sr and Ba, and having a molar ratio of Eu of more than 0 and less than 1.0, a molar ratio of Si of 5, and a molar ratio of N of 5, per 1 mol of the composition. The second nitride fluorescent material has a light emission peak wavelength in a range of 610 nm or more and 780 nm or less. In the case in which the fluorescent material layer 3 contains the second nitride fluorescent material, the light emitting device can emit light having a dominant wavelength in a range of 584 nm or more and 780 nm or less. In the case in which the fluorescent material layer 3 contains the second nitride fluorescent material, a light emitting device that has the target light emission intensity and has a light emission color within the target color tone range in the CIE 1931 chromaticity diagram can be obtained.

The second nitride fluorescent material preferably has a composition represented by the following formula (II):

$$(Ca_{1-p-q-r}Sr_pBa_qEu_r)_2Si_5N_8 \qquad (II)$$

wherein in the formula (II), p, q, and r satisfy $0\leq p\leq 1.0$, $0\leq q\leq 1.0$, $0<r<1.0$, and $p+q+r\leq 1.0$.

The fluorescent material layer 3 may contain at least one kind of a fluorescent material selected from the group consisting of the first nitride fluorescent material and the second nitride fluorescent material for emitting light having the target light emission peak wavelength. The fluorescent material layer 3 may contain both the first nitride fluorescent material and the second nitride fluorescent material. The fluorescent material layer 3 may further contain a fluorescent material other than the first nitride fluorescent material and the second nitride fluorescent material. The fluorescent material layer 3 may contain a fluorescent material that has a light emission peak wavelength in a range of 500 nm or more and 600 nm or less.

The fluorescent material layer 3 may further contain at least one kind of a fluorescent material selected from the group consisting of a rare earth aluminate fluorescent material having a composition containing Ce; a fluoride fluorescent material having a composition containing at least one kind of an element or ion selected from the group consisting of an alkali metal element and an ammonium ion, and at least one kind of an element selected from the group consisting of a Group 4 element and a Group 14 element, activated with $Mn^{4+}$; a fluorogermanate fluorescent material activated with $Mn^{4+}$; and an aluminum nitride fluorescent material having a composition containing at least one kind of an element selected from the group consisting of an alkaline earth metal element, and at least one kind of an element selected from the group consisting of an alkali metal element, activated with $Eu^{2+}$, in addition to the at least one kind of a fluorescent material selected from the group consisting of the first nitride fluorescent material and the second nitride fluorescent material.

The fluorescent material layer 3 may further contain at least one kind of a fluorescent material selected from the group consisting of a rare earth aluminate fluorescent material having a composition represented by the following formula (III), a fluoride fluorescent material having a composition represented by the following formula (IV), a fluorogermanate fluorescent material having a composition represented by the following formula (V), and an aluminum nitride fluorescent material having a composition represented by the following formula (VI):

$$(Ln_{1-y}Ce_y)_3Al_5O_{12} \qquad (III)$$

wherein in the formula (III), Ln represents at least one kind of an element selected from the group consisting of Y, Gd, Lu, and Tb, and y satisfies $0<y\leq 0.022$, $$A_2[M^1{}_{1-g}Mn^{4+}{}_gF_6] \qquad (IV)$$

wherein in the formula (IV), A represents at least one kind selected from the group consisting of K, Li, Na, Rb, Cs, and $NH_4^+$, $M^1$ represents at least one kind of an element selected from the group consisting of a Group 4 element and a Group 14 element, and g satisfies $0<g<0.2$, $$(i-j)MgO.(j/2)Sc_2O_3.kMgF_2.mCaF_2.(1-n)GeO_2.(n/2)M^2{}_2O_3:zMn^{4+} \qquad (V)$$

wherein in the formula (V), $M^2$ represents at least one kind selected from the group consisting of Al, Ga, and In, and i, j, k, m, n, and z satisfy $2\leq i\leq 4$, $0\leq j\leq 0.5$, $0<k<1.5$, $0\leq m<1.5$, $0<n<0.5$, and $0<z<0.05$, and $$(Ca_aSr_{1-a-c-d}Ba_dEu_c)_fLi_bAl_3N_e \qquad (VI)$$

wherein in the formula (VI), a, b, c, d, e, and f satisfy $0\leq a<1.0$, $0.8\leq b\leq 1.05$, $0.001<c\leq 0.1$, $0\leq d\leq 0.2$, $3.0\leq e\leq 5.0$, and $0.8\leq f\leq 1.05$.

The rare earth aluminate fluorescent material having a composition represented by the formula (III) has a light emission peak wavelength in a range of 500 nm or more and 600 nm or less. The fluoride fluorescent material having a composition represented by the formula (IV) has a light emission peak wavelength in a range of 610 nm or more and 780 nm or less. The fluorogermanate fluorescent material having a composition represented by the formula (V) has a light emission peak wavelength in a range of 610 nm or more and 780 nm or less. The aluminum nitride fluorescent material having a composition represented by the formula (VI) has a light emission peak wavelength in a range of 610 nm or more and 780 nm or less.

The fluorescent material layer 3 contains a fluorescent material having a reflectance to light having a wavelength of 450 nm of 10% or less and a light emission peak wavelength in a range of 610 nm or more and 780 nm or less, and thereby the light emitting device having the light emitting element having a light emission peak wavelength in a range of 380 nm or more and 485 nm or less can emit light in red color. Furthermore, the fluorescent material layer 3 may contain a fluorescent material having a light emission peak wavelength outside the range of 610 nm or more and 780 nm or less, and thereby the light emitting device can emit light in amber color.

Dielectric Multilayer Film 1

The dielectric multilayer film 1 includes two kinds of layers, i.e., a first dielectric material layer 1a and a second dielectric material layer 1b having refractive indices different from each other, which are periodically laminated alternately with a thickness of λ/4. λ is the peak wavelength of the wavelength range to be reflected, and is the in-medium wavelength in the dielectric material. It has been theoretically known that the dielectric multilayer film 1 has a higher reflectance with a larger difference in refractive index between the first dielectric material layer 1a and the second dielectric material layer 1b, and with a larger number of periods of the layers formed alternately. On the other hand, in the case in which the difference in refractive index between the two layers, i.e., the first dielectric material layer 1a and the second dielectric material layer 1b, is too large, or in the case in which the number of periods of the formation thereof is too large, the reflectance may be sharply decreased on both sides of the refraction peak wavelength A (i.e., the wavelength dependency may be sharp), and the wavelength dependency of the reflectance may be increased, making difficult to provide the target reflectance stably in the target wavelength range. Accordingly, in the dielectric multilayer film 1, the refractive indices and the difference in refractive index of the first dielectric material layer 1a formed of a dielectric material having a high refractive index and the second dielectric material layer 1b formed of a dielectric material having a low refractive index, and the number of periods thereof formed alternately are appropriately set to provide the target reflectance stably in the target wavelength range.

Specifically, the refractive index (first refractive index) of the first dielectric material layer 1a having a high refractive index may be set, for example, to a range of 1.5 or more and 3.0 or less, and preferably to a range of 2.0 or more and 2.6 or less. The refractive index (second refractive index) of the second dielectric material layer 1b having a low refractive index may be set, for example, to a range of 1.0 or more and 1.8 or less, and preferably to a range of 1.2 or more and 1.6 or less. The number of periods of the first dielectric material layer 1a and the second dielectric material layer 1b formed alternately may be set, for example, to a range of 1 or more and 30 or less, and preferably to a range of 1 or more and 20 or less.

The dielectric material constituting the first dielectric material layer 1a may be selected, for example, from $TiO_2$, $Nb_2O_3$, $Ta_2O_5$, and $Zr_2O_5$. The dielectric material constituting the second dielectric material layer 1b may be selected, for example, from $SiO_2$, $Al_2O_3$, and SiON.

The dielectric multilayer film 1 preferably has a high selectivity with a high reflectance in the reflection wavelength range and a high transmittance in the transmission wavelength range. The high selectivity of the dielectric multilayer film 1 means that the change of the reflectance or the transmittance is sharp between the reflection wavelength range and the transmission wavelength range.

Translucent Member 4

The dielectric multilayer film 1 and the fluorescent material layer 3 are provided on one surface of the translucent member 4, which supports the dielectric multilayer film 1 and the fluorescent material layer 3. The translucent member 4 used may be a plate member formed of a translucent material, such as glass or a resin. The glass may be selected, for example, from borosilicate glass and quartz glass. The resin may be selected, for example, from a silicone resin and an epoxy resin. The thickness of the translucent member 4 may be a thickness that does not lower the mechanical strength in the production process and can impart a sufficient mechanical strength to the fluorescent material layer 3.

Adhesive Layer 5

The adhesive layer 5 adheres the light emitting element 2 and the fluorescent material layer 3. The adhesive layer 5 is preferably formed of a material that can guide the light emitted from the light emitting element 2 to the fluorescent material layer 3 while preventing as much as possible the light from being attenuated. Specific examples thereof include an organic resin, such as an epoxy resin, a silicone resin, a phenol resin, and a polyimide resin.

Semiconductor Element 8

The semiconductor element 8 is a protective element for preventing the light emitting element 2 against breakage or performance deterioration of the element due to the application of an excessive voltage. Specifically, the semiconductor element 8 may be constituted by a Zener diode, which becomes a conducting state on application of a voltage higher than the prescribed voltage.

The height of the semiconductor element 8 in mounting is preferably lower than the laminated height of the light emitting element 2, the fluorescent material layer 3, the dielectric multilayer film 1, and the translucent member 4. The uppermost surface of the covering member 6 can be elevated by utilizing the outer shape of the semiconductor element 8, so as to suppress the shrinkage of the resin (i.e., the dent formed on the surface of the resin in curing).

Covering Member 6

The material used for the covering member 6 is preferably an insulating material. For example, a thermosetting resin or a thermoplastic resin may be used for securing the strength. Specific examples thereof include a phenol resin, an epoxy resin, a bismaleimide-triazine resin (BT resin), a polyphthalamide (PPA) resin, and a silicone resin. A filler that barely absorbs the light emitted from the light emitting element 2 and has a large difference in refractive index from the base resin may be dispersed in the base resin, so as to enable the efficient reflection of light. For example, the amount of a reflection member contained in the covering member 6 may be 30% by mass or more based on the total amount of the covering member 6 as 100% by mass. The reflection member may be the filler. The converting member 6 may include the fluorescent material along with the reflection member. The median diameter at a cumulative frequency of 50% in the volume based particle size distribution measured by the laser diffraction scattering method of the reflection member is, for example, 20 μm or more, and may be 100 μm or more, in consideration of the reflectance. In the case in which the reflection member has a shape that has a long axis and a short axis, such as an ellipsoidal shape, an acicular shape, a bar shape, a flaky shape, the long axis is, for example, 20 μm or more, and may be 100 μm or more, in consideration of the reflectance.

The covering member 6 may be formed, for example, in such a manner that on the upper side of the fixed substrate 10, the covering member 6 is charged between the light emission laminated part 20 including the light emitting element 2, the fluorescent material layer 3, the dielectric multilayer film 1, and the translucent member 4, and the semiconductor element 8, with a resin discharging device that is capable of moving (movable) in the vertical direction or the horizontal direction with respect to the substrate 10.

Filler

The covering member 6 may contain a filler that is hard to absorb the light emitted from the light emitting element 2 and has a large difference in refractive index from the base resin dispersed in the base resin, and thereby can efficiently reflect the light. The filler is preferably an oxide containing at least one kind of an element selected from the group consisting of yttrium, zirconium, aluminum, titanium, magnesium, and silicon. Examples of the filler include $SiO_2$, $Y_2O_3$, $TiO_2$, $Al_2O_3$, $ZrO_2$, and MgO. The amount of the filler contained in the covering member 6 is preferably in a range of 10 parts by mass or more and 100 parts by mass or less per 100 parts by mass of the resin in consideration of the reflectivity and the handleability.

Conductive Member 7

The conductive member 7 used may be a bump, and the material used for the bump may be Au or an alloy thereof, and other conductive bonding members, such as eutectic solder (Au—Sn), Pb—Sn, and lead-free solder. FIG. 1B shows an example where a bump is used as the conductive member 7, but the conductive member 7 is not limited to a bump, and may be, for example, a conductive paste.

Underfill

An underfill is a member for protecting the light emitting element 2, the semiconductor element 8, and the conductive member 7 disposed on the substrate from dusts, moisture, and external force. The underfill may be provided depending on necessity between the light emitting element 2 and the semiconductor element 8, and the conductive member 7. Examples of the material for the underfill include a silicone resin, an epoxy resin, and a urea resin. The underfill may contain a colorant, a light diffusing agent, and a filler, depending on necessity.

A method for producing the light emitting device will be described below.

The method for producing the light emitting device may include the following first to fourth steps in the order of the first step to the fourth step.

A: First step of mounting a light emitting element on a substrate
B: Second step of forming a dielectric multilayer film and a fluorescent material layer on a translucent member
C: Third step of disposing the translucent member having the dielectric multilayer film and the fluorescent material layer on the light emitting element and bonding thereto, so as to make a light emission laminated part
D: Fourth step of covering a side surface of the light emission laminated part except for the light emission surface thereof with a composition for a covering member, so as to form a covering member First Step In the first step, a light emitting element is disposed on a substrate, and mounted thereon. In the case in which an aggregate substrate is used, plural light emitting elements are disposed on the aggregate substrate. A semiconductor element may be disposed between one light emitting element and another light emitting element adjacent thereto in one of the raw direction and the column direction of the light emitting elements disposed. The light emitting element and the semiconductor element may be mounted on the substrate, for example, by a flip chip method.

Second Step

In the second step, a dielectric multilayer film and a fluorescent material layer are formed on a translucent member. A translucent member in a plate form is prepared. A dielectric multilayer film is then formed on the translucent member. For example, a first dielectric material layer and a second dielectric material layer having refractive indices different from each other are laminated alternately to form the dielectric multilayer film.

The dielectric multilayer film can be formed by forming the first dielectric material layer and the second dielectric material layer alternately by atomic layer deposition (ALD), sputtering, vapor deposition, and the formation of the films by the atomic layer deposition (ALD) is preferred since the first dielectric material layer and the second dielectric material layer each can be formed with a uniform thickness.

The dielectric multilayer film is formed to achieve a wavelength difference $\Delta Wp$ of 20 nm or more between the wavelength Wr showing a reflection intensity of 50% in the reflection spectrum of the dielectric multilayer film at an incident angle of 0° assuming that the maximum reflection intensity in a range of 380 nm or more and 780 nm or less in the reflection spectrum is 100%, and the wavelength Wfp showing a light emission intensity of 50% on the short wavelength side of the maximum light emission peak in the light emission spectrum of the fluorescent material assuming that the light emission intensity of the maximum light emission peak is 100%. Specifically, the light emission spectrum of the fluorescent material contained in the fluorescent material layer described below is measured in advance, and the wavelength Wfp showing a light emission intensity of 50% on the short wavelength side of the maximum light emission peak in the light emission spectrum of the fluorescent material assuming that the light emission intensity of the maximum light emission peak is 100% is measured. The dielectric multilayer film is formed through simulation for controlling the wavelength difference $\Delta Wp$ between the wavelength Wr and the wavelength Wfp to 20 nm or more. In the light emitting device, the light emitted from the light emitting element is reflected by the dielectric multilayer film, and the light subjected to the wavelength conversion by the fluorescent material is emitted from the light emitting device. In the case in which the light emission spectrum of the fluorescent material contained in the fluorescent material layer described below is measured in advance, and the wavelength difference $\Delta Wp$ is 20 nm or more between the wavelength Wfp showing a light emission intensity of 50% on the short wavelength side of the maximum light emission peak in the light emission spectrum of the fluorescent material assuming that the light emission intensity of the maximum light emission peak is 100%, and the wavelength Wr showing a reflection intensity of 50% in the reflection spectrum of the dielectric multilayer film assuming that the maximum reflection intensity in a range of 380 nm or more and 780 nm or less is 100%, the resulting light emitting device also has a wavelength difference $\Delta W$ of 20 nm or more between the wavelength Wf showing a light emission intensity of 50% on the short wavelength side of the maximum light emission peak in the light emission spectrum of the light emitting device assuming that the light emission intensity of the maximum light emission peak is 100%, and the wavelength Wr. In the light emitting device, the light emitted from the light emitting element is reflected by the dielectric multilayer film, and therefore the light emission spectrum of the light emitted from the light emitting element becomes substantially the same as the light emission spectrum of the fluorescent material contained in the fluorescent material layer. In the case in which the dielectric multilayer film is formed to have a wavelength Wr in the reflection spectrum of the resulting dielectric multilayer film that achieves a wavelength difference $\Delta Wp$ of 20 nm or more to the wavelength Wfp in the light emission spectrum of the fluorescent material contained in the fluorescent material layer, even though the directional angle is changed, the light in the wavelength range to be reflected is prevented from escaping from the dielectric multilayer film, whereas the light in the wavelength range to be transmitted is prevented from being reflected, and thus the color unevenness caused by the change in directional angle can be reduced to produce a light emitting device having improved directional chromaticity characteristics. The wavelength difference $\Delta Wp$ is preferably 30 nm or more, and more preferably in a range of 40 nm or more and 150 nm or less. The wavelength difference $\Delta Wp$ is preferably large, but a too large wavelength difference $\Delta Wp$ may cause deviation from the wavelength range of the target light emission color. Accordingly, the wavelength difference ΔWp is preferably in a range of 40 nm or more and 150 nm or less in relation to the wavelength range of the light reflected by the dielectric multilayer film and the wavelength range of the light emitted from the light emitting device.

The fluorescent material layer is then formed on the dielectric multilayer film. The fluorescent material layer may be formed on the dielectric multilayer film, for example, by a printing method. In the printing method, the fluorescent material layer may be formed in such a manner that a composition for forming a fluorescent material layer containing a fluorescent material, a binder, and depending on necessity a solvent is prepared, and the composition for forming a fluorescent material layer is coated on the surface of the dielectric multilayer film, and then dried. Examples of the binder used include an organic binder, such as an epoxy resin, a silicone resin, a phenol resin, and a polyimide resin, and an inorganic binder, such as glass. The fluorescent material layer contains the fluorescent material that is excited by the light emitted from the light emitting element having a wavelength in a range of 380 nm or more and 480 nm or less, and has a light emission peak wavelength in a range of 610 nm or more and 780 nm or less.

The fluorescent material layer may be formed by a compression molding method, a fluorescent material electrodeposition method, a fluorescent material sheet method, instead of the printing method. In the compression molding method, a material for forming a fluorescent material layer containing a binder and a fluorescent material is molded with a mold on the reflection film. In the fluorescent material electrodeposition method, a conductive thin film having transparency is formed on the surface of the reflection film in advance, and an electrically charged fluorescent material is accumulated on the thin film through electrophoresis. In the fluorescent material sheet method, a fluorescent material is kneaded with a silicone resin and processed into a sheet form to provide a fluorescent material sheet, which is fixed to the surface of the reflection film. For example, a fluorescent material film having a thickness of 100 µm or less is fixed to the reflection film by bonding to the surface thereof under pressure.

The translucent member having the dielectric multilayer film and the fluorescent material layer formed thereon is divided into pieces each having a size that is capable of being disposed on the light emission surface of the light emitting element. According to the procedures above, the translucent member having the dielectric multilayer film and the fluorescent material layer fixed thereto is obtained. In the following description, the translucent member having the dielectric multilayer film and the fluorescent material layer is referred to as a translucent laminated member. The translucent laminated member divided into pieces preferably has the shape of the surface of the fluorescent material layer that has a plane area slightly larger than the light emission surface of the light emitting element, in consideration of the mounting accuracy.

Third Step

In the third step, the fluorescent material layer is faced to the light emission surface of the light emitting element, and the translucent laminated member is bonded to the light emitting element with the adhesive layer. According to the procedure, the light emission laminated part including the light emitting element and the translucent laminated member is produced. In a preferred embodiment, the bonding surface of the translucent laminated member to the light emitting element, i.e., the bonding surface of the fluorescent material layer to the light emitting element, is larger than the light emission surface of the light emitting element, and therefore the adhesive running off from the light emission surface of the light emitting element is attached to the side surface of the light emitting element, resulting in a runoff part of the adhesive having an approximately triangular vertical cross section. The runoff part of the adhesive attached to the side surface of the light emitting element has a triangular shape having a thickness of the layer that is decreased toward the lower part of the light emitting element.

Fourth Step

In the fourth step, the side surface of the light emission laminated part other than the light emission surface is covered with a composition for forming a covering member, so as to form a covering member on the side surface of the light emission laminated part other than the light emission surface. In the case in which plural light emitting elements and semiconductor elements are disposed on the aggregate substrate, and the translucent laminated members are bonded to the light emitting elements to form the light emission laminated parts, the composition for forming a covering member is filled between the light emission laminated parts. The covering member is to reflect the light emitted from the light emitting element, and is formed to cover the side surface of the light emission laminated part without covering the upper surface thereof and to bury the semiconductor element. The runoff part attached to the side surface of the light emitting element has a triangular cross sectional shape having a thickness that is decreased toward the lower part of the light emitting element, and therefore the covering member covering the side surface of the light emitting element has an inclination spreading upward. According to the structure, the light emitted from the side surface of the light emitting element is reflected toward the fluorescent material layer and thus can excite the fluorescent material, resulting in the enhancement of the luminance.

In the case in which plural light emission laminated parts are formed on the aggregate substrate, the covering member and the aggregate substrate are cut into individual light emitting devices each including one light emitting element and one semiconductor element.

According to the procedures described above, the light emitting device of the embodiment shown in FIGS. 1A and 1B can be produced. In the case in which a light emitting device having no substrate is produced, the substrate may be removed after forming the covering member, or after forming the covering member and before or after cutting the substrate.

In the description of the embodiment above, the example of the light emitting device having the dielectric multilayer film provided between the translucent member and the fluorescent material layer, but the dielectric multilayer film may be provided on the translucent member. In other words, the translucent member may be disposed between the fluorescent material layer and the dielectric multilayer film. Even in the case in which the light emitting device is constituted in this manner, the light emitted from the light emitting element can be prevented from being emitted outside the light emitting device, by covering the entire side surface of the light emission laminated part with the reflection resin.

EXAMPLES

Embodiments of the present invention will be described more specifically with reference to examples below. However, the present invention is not limited to the examples.

Fluorescent Material

In the light emitting devices of Examples and Comparative Examples, a fluorescent material 1, a fluorescent material 2, and a fluorescent material 3 shown in Table 1 were used. In the fluorescent material 1, the fluorescent material 2, and the fluorescent material 3, the first nitride fluorescent material was used. The evaluation method for the fluorescent material shown in Table 1 is described below.

Evaluation of Fluorescent Material

Compositional Analysis

The fluorescent material 1, the fluorescent material 2, and the fluorescent material 3 were analyzed for the composition with an ICP-AES apparatus (manufactured by PerkinElmer, Inc.), an ion chromatography system (manufactured by Dionex Japan, Ltd.), and an oxygen-nitrogen analyzer (manufactured by Horiba, Ltd.), and the molar ratios of the constitutional elements in the composition were calculated based on Al as 0.9 or 1. The compositions of the fluorescent materials are shown in Table 1.

Average Particle Diameter

The fluorescent materials were measured for the average particle diameter by the FSSS method with Fisher Sub-Sieve Sizer Model 95 (manufactured by Fisher Scientific International, Inc.). Specifically, a specimen in a volume of 1 cm$^3$ was collected and packed in a dedicated tube container, then dry air was flowed through the container at a constant pressure, and the specific surface area was read from the differential pressure, which was converted to the average particle diameter (Fisher sub-sieve sizer's number).

Light Emission Characteristics

Figure 2A:
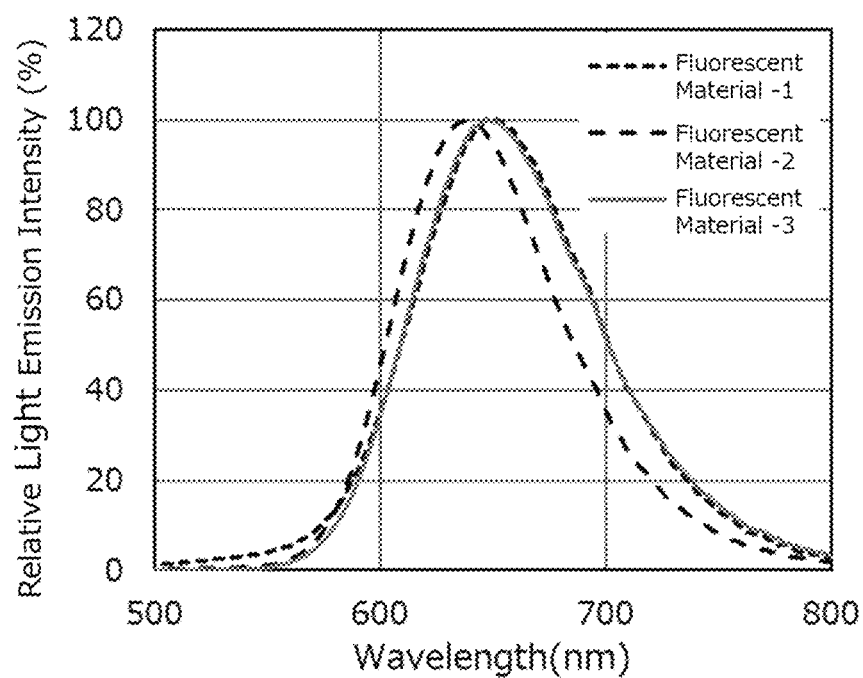
FIG. 2A is a chart showing the relative light emission spectra of the fluorescent material 1, the fluorescent material 2, and the fluorescent material 3.

The fluorescent materials were measured for the light emission characteristics. For the light emission characteristics of the fluorescent material, the light emission spectrum at room temperature (25° C.±5° C.) was measured by irradiating the fluorescent material with excitation light having a wavelength of 450 nm with a quantum efficiency measuring apparatus (Model Name: QE-2000, manufactured by Otsuka Electronics Co., Ltd.). The light emission peak wavelength (nm) was obtained from the resulting light emission spectrum of the fluorescent material. The wavelength Wfp showing a light emission intensity of 50% on the short wavelength side of the maximum light emission peak in the light emission spectrum of the fluorescent material assuming that the light emission intensity of the maximum light emission peak was 100% was measured. FIG. 2A shows the light emission spectra of the fluorescent materials.

Reflection Spectrum

Figure 2B:
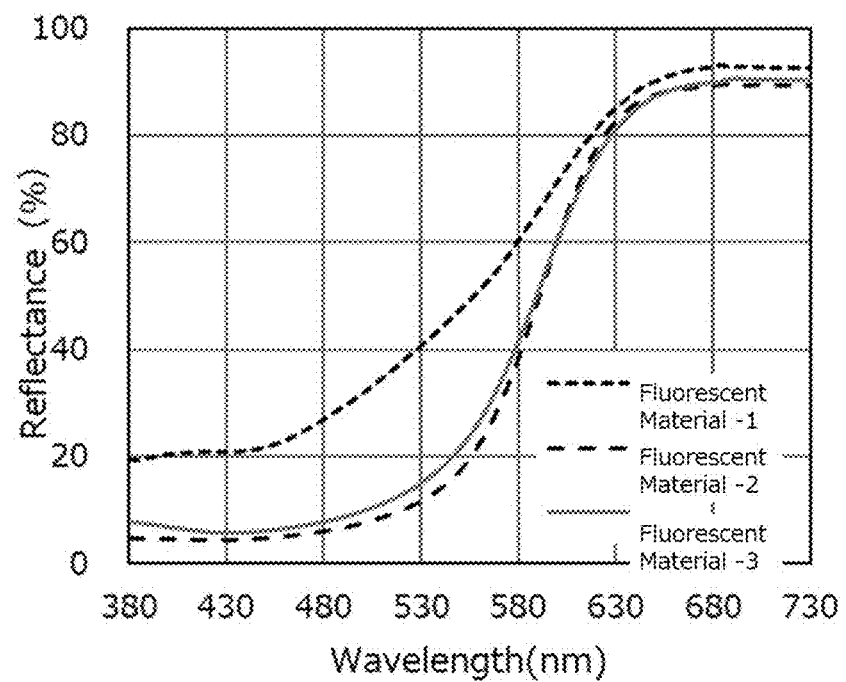
FIG. 2B is a chart showing the reflection spectra of the fluorescent material 1, the fluorescent material 2, and the fluorescent material 3 used in the light emitting devices of Examples and Comparative Examples.

The fluorescent materials 1 to 3 as specimens each were irradiated with light emitted from an excitation light source (xenon lamp) and measured for the reflection spectrum in a range of 380 nm or more and 780 nm or less at room temperature (25° C.±5° C.) with a spectral photometer (Model name: F-4500, manufactured by Hitachi High-Tech Corporation). Calcium hydrogen phosphate ($CaHPO_4$) was used as the standard specimen. The reflectance at 450 nm of each of the fluorescent materials 1 to 3 was obtained as a relative reflectance based on the reflectance of calcium hydrogen phosphate to the excitation light having an excitation wavelength of 450 nm. FIG. 2B shows the reflection spectra of the fluorescent materials.

TABLE 1

| | Composition | Average particle diameter (μm) | Reflectance at wavelength of 450 nm (%) | Light emission peak wavelength (nm) | Wavelength Wfp (nm) |
|---|---|---|---|---|---|
| Fluorescent material 1 | $Ca_{0.905}Eu_{0.005}Si_{1.10}Al_{0.9}N_{2.913}$ | 6.4 | 21.8 | 647 | 609 |
| Fluorescent material 2 | $Sr_{0.733}Ca_{0.202}Eu_{0.021}Si_{1.05}AlN_{2.906}$ | 14.8 | 5.0 | 639 | 603 |
| Fluorescent material 3 | $Sr_{0.511}Ca_{0.403}Eu_{0.015}Si_{1.05}AlN_{2.902}$ | 11.0 | 6.3 | 648 | 609 |

Dielectric Multilayer Film

In the light emitting devices of Examples and Comparative Examples, a dielectric multilayer film 1 (DBR-1) or a dielectric multilayer film 2 (DBR-2) was used.

Reflection Spectrum

Figure 3:
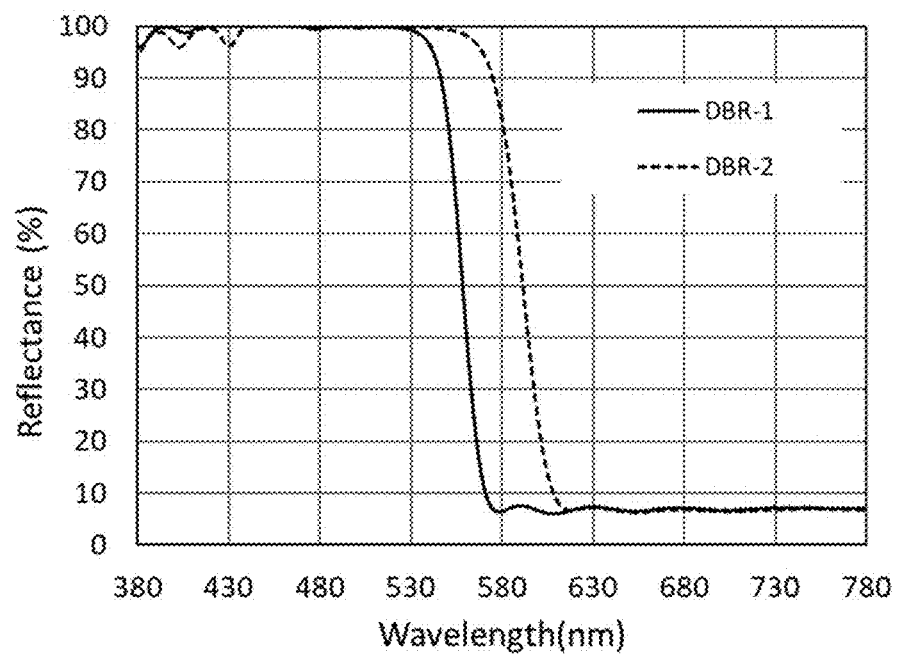
FIG. 3 is a chart showing the reflection spectra at an incident angle of 0° of the dielectric multilayer film 1 (DBR-1) and the dielectric multilayer film 2 (DBR-2) used in the light emitting devices of Examples and Comparative Examples.

The dielectric multilayer films each were irradiated with light emitted from an excitation light source in the normal direction of the dielectric multilayer film (i.e., an incident angle of 0°) and measured for the reflection spectrum in a range of 380 nm or more and 780 nm or less at room temperature (25° C.±5° C.) with a spectral photometer (Model name: V-670, manufactured by JASCO Corporation). FIG. 3 shows the reflection spectra of the dielectric multilayer film 1 (DBR-1) and the dielectric multilayer film 2 (DBR-2). The wavelength Wr showing a reflection intensity of 50% in the reflection spectrum of the dielectric multilayer film assuming that the maximum reflection intensity in a range of 380 nm or more and 780 nm or less in the reflection spectrum of the dielectric multilayer film at an incident angle of 0° is 100% was measured. The results are shown in Table 2.

TABLE 2

| | Wavelength Wr (nm) |
|---|---|
| DBR-1 | 559 |
| DBR-2 | 592 |

Example 1

A light emitting device 100 shown in FIGS. 1A and 1B was produced.

First Step

An aluminum nitride substrate was used as the substrate 10. A nitride semiconductor emitting light having a light emission peak wavelength of 450 nm was used as the light emitting element 2. The light emitting element 2 was placed on the substrate 10 and mounted thereon by a flip chip method.

Second Step

A glass plate having a thickness of 150 μm was used as the translucent member 4.

The dielectric multilayer film 1 (DBR-1) shown in Table 2 was produced on the translucent member 4. Specifically, the dielectric multilayer film was produced in such a manner that the first dielectric material layer 1a formed of $Nb_2O_4$ and the second dielectric material layer 1b formed of $SiO_2$ were laminated on the translucent member 4 in the order of the second dielectric material layer 1b and the first dielectric material layer 1a alternately in 15.5 periods (31 layers in total) by the sputtering method. The lamination order of the first dielectric material layer 1a and the second dielectric material layer 1b was different from the order of the first dielectric material layer 1a and the second dielectric material layer 1b shown in FIG. 1B. The dielectric multilayer film 1 (DBR-1) was produced to achieve a wavelength difference ΔWp of 20 nm or more between the wavelength Wr showing a reflection intensity of 50% in the reflection spectrum of the dielectric multilayer film at an incident angle of 0° assuming that the maximum reflection intensity in a range of 380 nm or more and 780 nm or less in the reflection spectrum was 100%, and the wavelength Wfp showing a light emission intensity of 50% on the short wavelength side of the maximum light emission peak in the light emission spectrum of the fluorescent material 2 and the fluorescent material 3 contained in the fluorescent material layer 3 assuming that the light emission intensity of the maximum light emission peak was 100%.

The fluorescent material layer 3 was produced by coating a composition for forming a fluorescent material layer containing a silicone resin, the fluorescent material 2, and the fluorescent material 3 on the dielectric multilayer film 1 by the printing method. The composition for forming a fluorescent material layer contains 186 parts by mass in total the fluorescent material 2 and the fluorescent material 3 mixed with 100 parts by mass of the silicone resin. The fluorescent material 2 and the fluorescent material 3 were mixed to make a mass ratio of 1/1. The thickness of the fluorescent material layer 3 was 71 μm.

A translucent laminated member including the dielectric multilayer film 1 and the fluorescent material layer 3 laminated on the translucent member 4 was thus provided. The translucent laminated member was divided into pieces to be enabled to mount on the light emitting element 2.

Third Step

The fluorescent material layer 3 of the translucent laminated member divided into pieces was faced to the light emission surface of the light emitting element 2, and the translucent laminated member was bonded to the light emitting element 2 with an adhesive layer containing a silicone resin, so as to produce a light emission laminated part 20.

Fourth Step

The circumference of the light emission laminated part 20 other than the light emission surface of the light emission laminated part 20 was covered with a composition for forming a covering member, and the composition for forming a covering member was cured to form the covering member 6, thereby producing the light emitting device 100. The composition for forming a covering member contained a silicone resin and a titanium oxide ($TiO_2$) filler. The amount of the filler mixed in the composition for forming a covering member was 60 parts by mass of the filler mixed with 100 parts by mass of the silicone resin.

Example 2

The light emitting device 100 was produced in the same manner as in Example 1 except that the fluorescent material 3 was used instead of the fluorescent material 2 and the fluorescent material 3, and the thickness of the fluorescent material layer 3 was changed to 129 μm.

Example 3

The light emitting device 100 was produced in the same manner as in Example 1 except that the fluorescent material 3 was used instead of the fluorescent material 2 and the fluorescent material 3, and the thickness of the fluorescent material layer 3 was changed to 73 μm.

Example 4

The light emitting device 100 was produced in the same manner as in Example 1 except that the dielectric multilayer film 2 (DBR-2) shown in Table 2 was formed on the translucent member 4, the fluorescent material 3 was used instead of the fluorescent material 2 and the fluorescent material 3, and the thickness of the fluorescent material layer 3 was changed to 128 μm. Specifically, the dielectric multilayer film 2 (DBR-2) was produced in such a manner that the first dielectric material layer 1a formed of $Nb_2O_4$ and the second dielectric material layer 1b formed of $SiO_2$ were laminated on the translucent member 4 in the order of the second dielectric material layer 1b and the first dielectric material layer 1a in 14.5 periods (29 layers in total) by the sputtering method.

Comparative Example 1

The light emitting device 100 was produced in the same manner as in Example 1 except that the fluorescent material 1 having a reflectance to light having a wavelength of 450 nm or 21.8% was used instead of the fluorescent material 2 and the fluorescent material 3, and the thickness of the fluorescent material layer 3 was changed to 67 μm.

Comparative Example 2

The dielectric multilayer film 2 (DBR-2) shown in Table 2 was formed on the translucent member 4. Specifically, the light emitting device 100 was produced in the same manner as in Example 1 except that the fluorescent material 3 was used instead of the fluorescent material 2 and the fluorescent material 3, and the dielectric multilayer film 2 (DBR-2) was produced to achieve a wavelength difference ΔWp of 16 nm between the wavelength Wr showing a reflection intensity of 50% in the reflection spectrum of the dielectric multilayer film 2 (DBR-2) at an incident angle of 0° assuming that the maximum reflection intensity in a range of 380 nm or more and 780 nm or less in the reflection spectrum was 100%, and the wavelength Wfp showing a light emission intensity of 50% on the short wavelength side of the maximum light emission peak in the light emission spectrum of the fluorescent material 3 contained in the fluorescent material layer 3 assuming that the light emission intensity of the maximum light emission peak was 100%, and the thickness of the fluorescent material layer 3 was changed to 75 μm.

The fluorescent material, the dielectric multilayer film, the thickness of the fluorescent material layer, and the amount of the fluorescent material mixed in the composition for forming a fluorescent material per 100 parts by mass of the resin are shown in Table 3.

Evaluation of Light Emitting Device

The light emitting devices of Examples and Comparative Examples were evaluated as follows. In the following evaluation, the light emitting device was measured under application of an electric current of 350 mA. The results are shown in Table 4.

Chromaticity Coordinate (x,y), Dominant Wavelength, Color Purity

The light emitting devices of Examples and Comparative Examples each were measured for the chromaticity coordinate (x,y) in the chromaticity coordinate system of CIE 1931, the dominant wavelength, and the color purity with an optical measurement system combining a multichannel spectroscope and an integral sphere. The chromaticity coordinate (x,y) of the light emitting device means a chromaticity coordinate (x,y) at a directional angle of 0° in the directional chromaticity coordinate (x,y) described below.

The dominant wavelength means, in the CIE 1931 chromaticity diagram, the wavelength at the intersection point of the spectrum locus and the extended line of the straight line connecting the chromaticity coordinate of white light (x=0.3333, y=0.3333) and the chromaticity coordinate (x,y) of the light emission color of the light emitting device.

The color purity means, in the CIE 1931 chromaticity diagram, a value obtained by dividing the distance on the straight line connecting the chromaticity coordinate of white light (x=0.3333, y=0.3333) and the chromaticity coordinate (x,y) of the light emission color of the light emitting device by the distance on the straight line connecting the chromaticity coordinate of white light and the intersection point thereof and the spectrum locus through the chromaticity of the light emitted from the light emitting device. A larger value of the color purity means the light emitting device emits light that is closer to monochromatic light.

Relative Light Flux

The light emitting devices of Examples and Comparative Examples each were measured for the total light flux with a spectral photometer using an integral sphere (PMA-11, manufactured by Hamamatsu Photonics K.K.). The total light flux of the light emitting device was expressed as a relative value based on the total flux of the light emitted from the light emitting device of Comparative Example 1 as 100%.

Light Emission Peak Wavelength, Intensity Ratio Ie/Im, Wavelength Wf, and Wavelength Difference ΔW The light emitting devices of Examples and Comparative Examples each were measured for the light emission spectrum with a spectral photometer using an integral sphere (PMA-11, manufactured by Hamamatsu Photonics K.K.). In each of the light emission spectra of the light emitting devices, the light emission peak wavelength of the maximum light emission peak and the wavelength Wf showing a light emission intensity of 50% on the short wavelength side of the maximum light emission peak assuming that the light emission intensity of the maximum light emission peak was 100% were obtained. For each of the dielectric multilayer films used in the light emitting devices, the wavelength difference ΔW between the wavelength Wr showing a reflection intensity of 50% in the reflection spectrum of the dielectric multilayer film at an incident angle of 0° assuming that the maximum reflection intensity in a range of 380 nm or more and 780 nm or less in the reflection spectrum was 100% and the wavelength Wf was obtained.

In each of the light emission spectra of the light emitting devices, the intensity ratio Ie/Im of the light emission peak intensity Ie of the light emitting element at a wavelength of 450 nm as the light emission peak wavelength thereof and the light emission intensity Im of the maximum light emission peak of the light emitting device was obtained.

Directional Chromaticity Coordinate (x,y)

Figure 4:
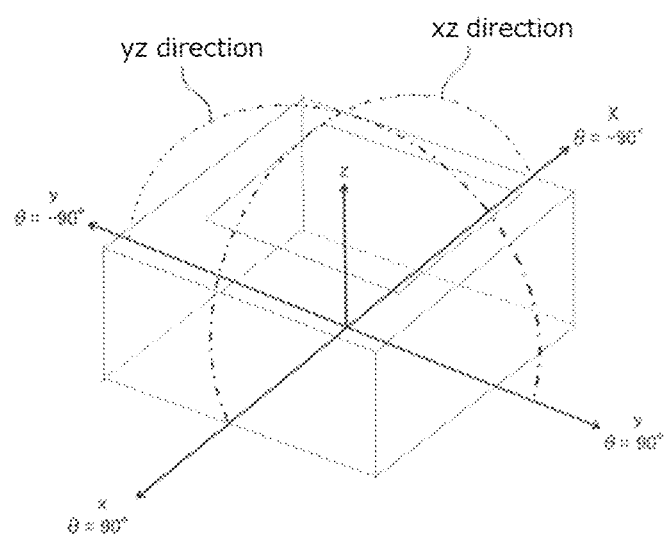
FIG. 4 is a schematic diagram showing the direction for measuring the directional chromaticity coordinate (x,y) of the light emission color of the light emitting device.

The directional chromaticity coordinate of the light emission color of the light emitting device was measured. Specifically, the light emitting devices of Examples and Comparative Examples each were applied with an electric current of 350 mA to emit light, and the directional chromaticity coordinate (x,y) of the light emitting device was measured with a spectral photometer (Model No.: PMA-11, manufactured by Hamamatsu Photonics K.K.) under Condition B as the average LED luminance measurement recommended by CIE while changing the directional angle by rotating the light emitting device with a goniometer. FIG. 4 is a schematic diagram showing the direction for measuring the directional chromaticity coordinate (x,y) of the light emission color of the light emitting device. The measurement was performed with a directional angle θ as the inclination angle from the light axis C of the light emitting device to the horizontal direction to the light emission surface of the light emitting device. The light axis C of the light emitting device is the direction that is in parallel to the z axis in the normal direction of the light emission surface of the light emitting device and passes through the center point of the light emitting device, and has a directional angle of 0°. For the directional chromaticity, specifically, in the x-z plane shown in FIG. 4, the z axis with respect to the x-y plane was designated as a directional angle of 0°, and the inclination angle θ from the z axis toward the x-y plane in the x-z plane was designated as the directional angle θ. In the chromaticity coordinate of the CIE chromaticity diagram, the directional chromaticity coordinate $(x_0, y_0)$ at a directional angle of 0° and the directional chromaticity $(x_\theta, y_\theta)$ at a directional angle θ were measured. The difference Δx in the x coordinate between the x coordinate $x_0$ at a directional angle of 0° and the x coordinate $x_{60}$ at a directional angle of 60°, and the difference Δy in the y coordinate between the y coordinate $y_0$ at a directional angle of 0° and the y coordinate $y_{60}$ at a directional angle of 60° are shown in Table 4. In the light emitting devices of Examples and Comparative Examples, the semiconductor device existed in a range of θ=0° to θ=+90° in the x-z plane, and therefore the difference in the x coordinate in a range of θ=0° to θ=−90° in the x-z plane was considered. The range of θ=−80° to θ=−90° is close to the horizontal direction to the light emission surface of the light emitting device, and thus it is considered that the light emitting device is substantially not viewed from the range in the practical use.

TABLE 3

|  | Fluorescent material used | Dielectric multilayer film DBR | Thickness of fluorescent material layer (μm) | Amount of fluorescent material to resin (% by mass) |
|---|---|---|---|---|
| Comparative Example 1 | fluorescent material 1 | DBR-1 | 67 | 186 |
| Example 1 | fluorescent material 2 + fluorescent material 3 | DBR-1 | 71 | 186 |

TABLE 3-continued

|  | Fluorescent material used | Dielectric multilayer film DBR | Thickness of fluorescent material layer (μm) | Amount of fluorescent material to resin (% by mass) |
|---|---|---|---|---|
| Example 2 | fluorescent material 3 | DBR-1 | 129 | 186 |
| Example 3 | fluorescent material 3 | DBR-1 | 73 | 186 |
| Example 4 | fluorescent material 3 | DBR-2 | 128 | 186 |
| Comparative Example 2 | fluorescent material 3 | DBR-2 | 75 | 186 |

TABLE 4

| | Light emitting device (350 mA) | | | | | | | | |
|---|---|---|---|---|---|---|---|---|---|
| | Chromaticity | | Dominant wavelength | Color purity | Relative light flux | Intensity | Wavelength Wf | Wavelength difference ΔW | Directional chromaticity (x-z direction) | |
| | x | y | (nm) | (%) | (%) | ratio Ie/lm | (nm) | (nm) | Δx (−60°) | Δy (−60°) |
| Comparative Example 1 | 0.660 | 0.325 | 613 | 96 | 100 | 0.018 | 610 | 52 | −0.015 | 0.002 |
| Example 1 | 0.668 | 0.326 | 613 | 98 | 125 | 0.007 | 603 | 45 | −0.004 | 0.000 |
| Example 2 | 0.682 | 0.312 | 618 | 98 | 78 | 0.006 | 612 | 54 | −0.004 | −0.002 |
| Example 3 | 0.671 | 0.322 | 614 | 98 | 108 | 0.008 | 607 | 49 | −0.004 | −0.001 |
| Example 4 | 0.683 | 0.312 | 619 | 98 | 78 | 0.007 | 612 | 21 | −0.009 | 0.004 |
| Comparative Example 2 | 0.673 | 0.321 | 615 | 98 | 104 | 0.008 | 608 | 16 | −0.014 | 0.009 |

The light emitting devices of Examples 1 to 4 each had a high color purity, a wavelength difference ΔW of 20 nm or less, and a difference Δx in the x coordinate of as small as 0.010 or less. As a result, in Examples 1 to 4, the difference between the light emission color visually recognized at a directional angle of 0° and the light emission color visually recognized at a directional angle of 60° was small, and the color unevenness caused by the change in directional angle was reduced to provide good directional chromaticity characteristics of the light emitting device.

The light emitting device of Comparative Example 1 used the fluorescent material 1 having a reflectance to light having a wavelength of 450 nm or 21.8%. Accordingly, the light emitting device did not perform efficiently the wavelength conversion of the light emitted from the light emitting element, and even though the wavelength difference ΔW was 20 nm or more, the light emitted from the light emitting element 2 escaped from the dielectric multilayer film, the absolute value of the difference Δx in the x coordinate exceeded beyond 0.010, color unevenness occurred by the change in directional angle, and the directional chromaticity characteristics were deteriorated.

The light emitting device of Comparative Example 2 had a wavelength difference ΔW of less than 20 nm, the wavelength range where the reflection intensity was decreased in the reflection spectrum of the dielectric multilayer film 2 (DBR-2) and the wavelength range where the light emission intensity was increased in the light emission spectrum of the light emitting device partially overlapped each other, and the absolute value of the difference Δx in the x coordinate exceeded beyond 0.010. As a result, the light emitting device of Comparative Example 2 suffered color unevenness caused by the change in directional angle and had deteriorated directional chromaticity characteristics. It is considered that the deteriorated chromaticity characteristics of the light emitting device of Comparative Example 2 occur since a part of the light emitted from the light emitting element escapes according to the change in directional angle, the light subjected to the wavelength conversion by the fluorescent material to be transmitted is reflected by the dielectric multilayer film, and the reflected light escapes from the dielectric multilayer film by the change in directional angle, resulting in color unevenness by the change in directional angle.

Figure 5:
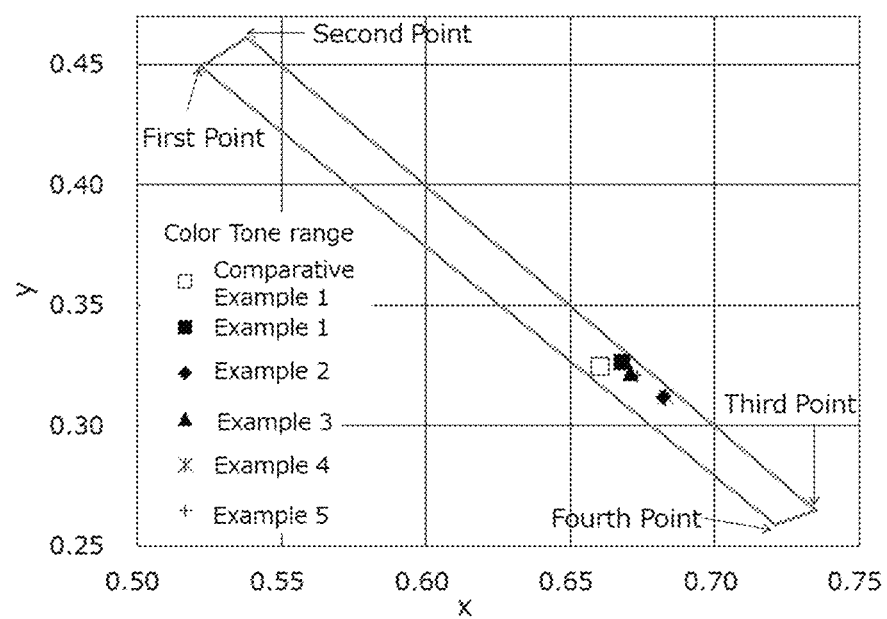
FIG. 5 is a chart showing the chromaticity coordinate (x,y) of the light emitting devices of Examples and Comparative Example and the target color tone range, in the CIE 1931 chromaticity diagram.

FIG. 5 is a chart showing the chromaticity coordinate (x,y) at a directional angle of 0° of the light emitting devices of Examples and Comparative Example and the target color tone range, in the CIE chromaticity diagram. The target color tone range is the interior of the region that is demarcated by a first straight line connecting a first point and a second point, a second straight line connecting a second point and a third point, a third straight line connecting a third point and a fourth point, and a fourth straight line connecting a fourth point and a first point, wherein in an xy chromaticity coordinate system of the CIE 1931 chromaticity diagram, the chromaticity coordinate (x,y) is (x=0.522, y=0.449) for the first point, (x=0.538, y=0.461) for the second point, (x=0.735, y=0.265) for the third point, and (x=0.721, y=0.259) for the fourth point. As shown in FIG. 5, the chromaticity coordinates (x,y) of the light emission colors of the light emitting devices of Examples and Comparative Examples are all within the target color tone range, and the light emitting devices each emit light of amber color to red color.

Figure 6:
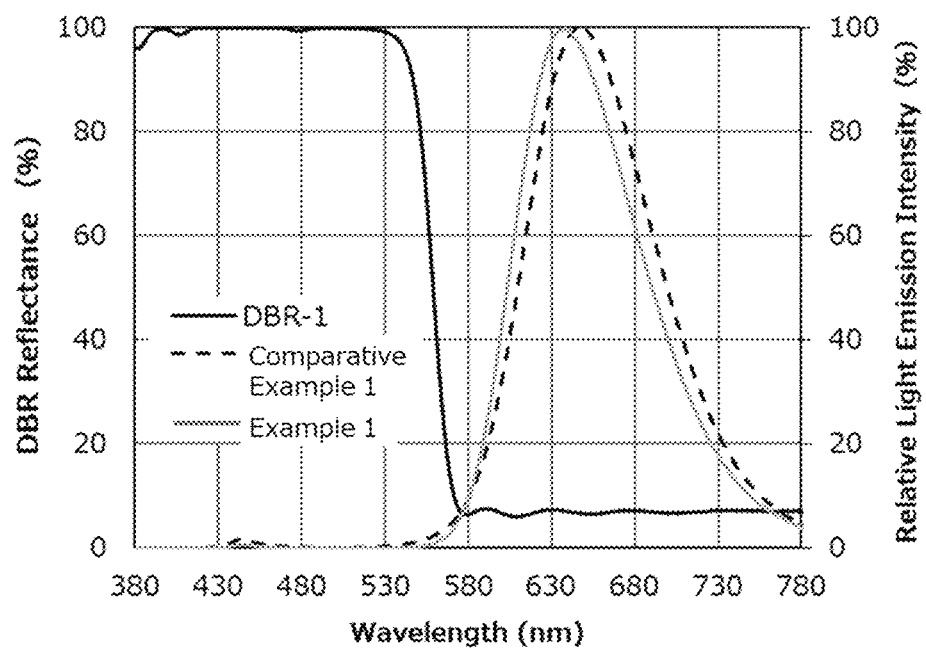
FIG. 6 is a chart showing the reflection spectrum of the dielectric multilayer film 1 (DBR-1) at an incident angle of 0° and the relative light emission spectra of the light emitting device of Example 1 and the light emitting device of Comparative Example 1.

FIG. 6 is a chart showing the reflection spectrum of the dielectric multilayer film 1 (DBR-1) at an incident angle of 0° and the relative light emission spectra of the light emitting device of Example 1 and the light emitting device of Comparative Example 1. The relative light emission spectrum is a light emission spectrum shown with the light emission intensity at the maximum light emission peak wavelength of the light emitting device assumed to be 100%. As shown in FIG. 6, the light emitting device of Example 1 and the light emitting device of Comparative Example 1 each had a wavelength difference ΔW of 40 nm or more, and the wavelength range where the reflection intensity was decreased in the reflection spectrum and the wavelength range where the light emission intensity was increased in the light emission spectrum of the light emitting device substantially did not overlap each other.

Figure 7:
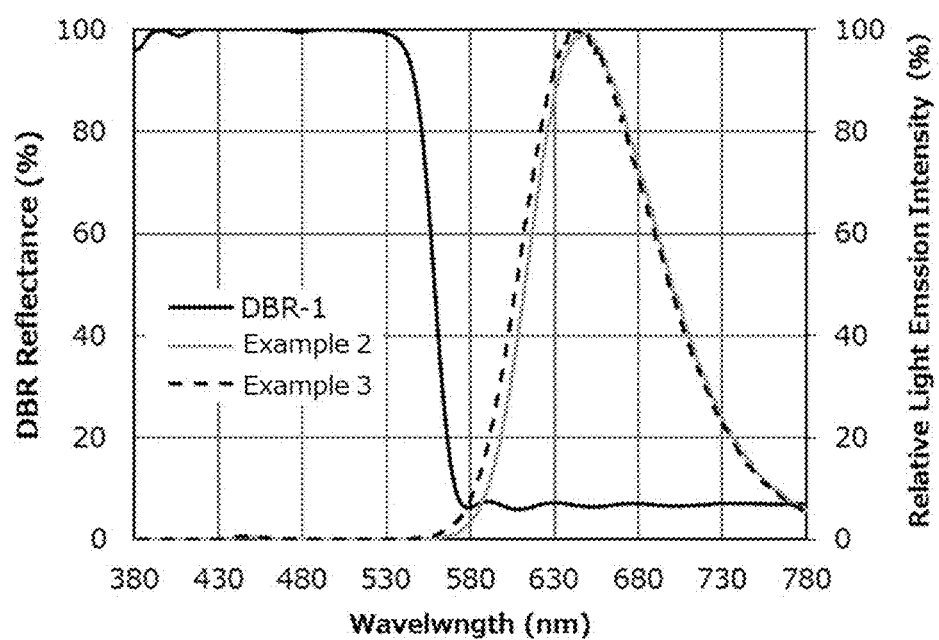
FIG. 7 is a chart showing the reflection spectrum of the dielectric multilayer film 1 (DBR-1) at an incident angle of 0° and the relative light emission spectra of the light emitting device of Example 2 and the light emitting device of Example 3.

FIG. 7 is a chart showing the reflection spectrum of the dielectric multilayer film 1 (DBR-1) at an incident angle of 0° and the relative light emission spectra of the light emitting device of Example 2 and the light emitting device of Example 3. As shown in FIG. 7, the light emitting device of Example 2 and the light emitting device of Example 3 each had a wavelength difference ΔW of 40 nm or more, and the wavelength range where the reflection intensity was decreased in the reflection spectrum and the wavelength range where the light emission intensity was increased in the light emission spectrum of the light emitting device substantially did not overlap each other.

Figure 8:
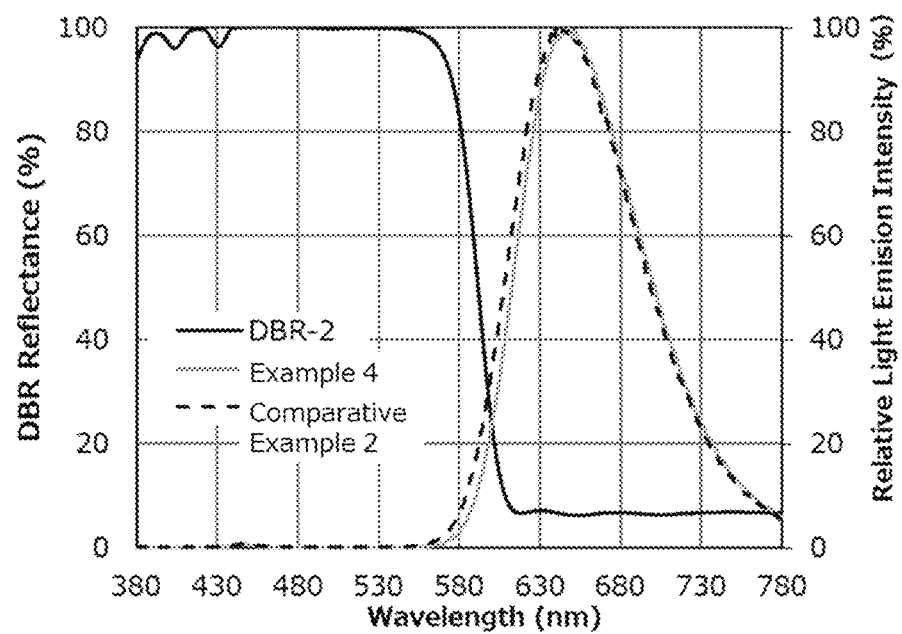
FIG. 8 is a chart showing the reflection spectrum of the dielectric multilayer film 2 (DBR-2) at an incident angle of 0° and the relative light emission spectra of the light emitting device of Example 4 and the light emitting device of Comparative Example 2.

FIG. 8 is a chart showing the reflection spectrum of the dielectric multilayer film 2 (DBR-2) at an incident angle of 0° and the relative light emission spectra of the light emitting device of Example 4 and the light emitting device of Comparative Example 2. The light emitting device of Example 4 had a wavelength difference ΔW of 21 nm, and the wavelength range where the reflection intensity was decreased in the reflection spectrum and the wavelength range where the light emission intensity was increased in the light emission spectrum of the light emitting device partially overlapped each other. The light emitting device of Comparative Example 2 had a wavelength difference ΔW of 16 nm, and the wavelength range where the reflection intensity was decreased in the reflection spectrum and the wavelength range where the light emission intensity was increased in the light emission spectrum of the light emitting device overlapped each other more largely than Example 4. Both the light emitting device of Example 4 and the light emitting device of Comparative Example 2 included the dielectric multilayer film 2 (DBR-2) and the fluorescent material 3 in the light emitting device. However, due to the difference in the thickness of the fluorescent material layer, i.e., 128 μm for the thickness of the fluorescent material layer of the light emitting device of Example 4 and 75 μm for the thickness of the fluorescent material layer of the light emitting device of Comparative Example 2, the wavelength Wf in the light emission spectrum of the light emitting device was differentiated therebetween, and the light emitting device of Example 4 had a wavelength difference ΔW of 20 nm or more. The light emitting device of Example 4 had a smaller overlap of the wavelength range where the reflection intensity was decreased in the reflection spectrum and the wavelength range where the light emission intensity was increased in the light emission spectrum of the light emitting device than the light emitting device of Comparative Example 2, and thus had reduced color unevenness caused by the change in directional angle and good directional chromaticity characteristics.

Figure 9:
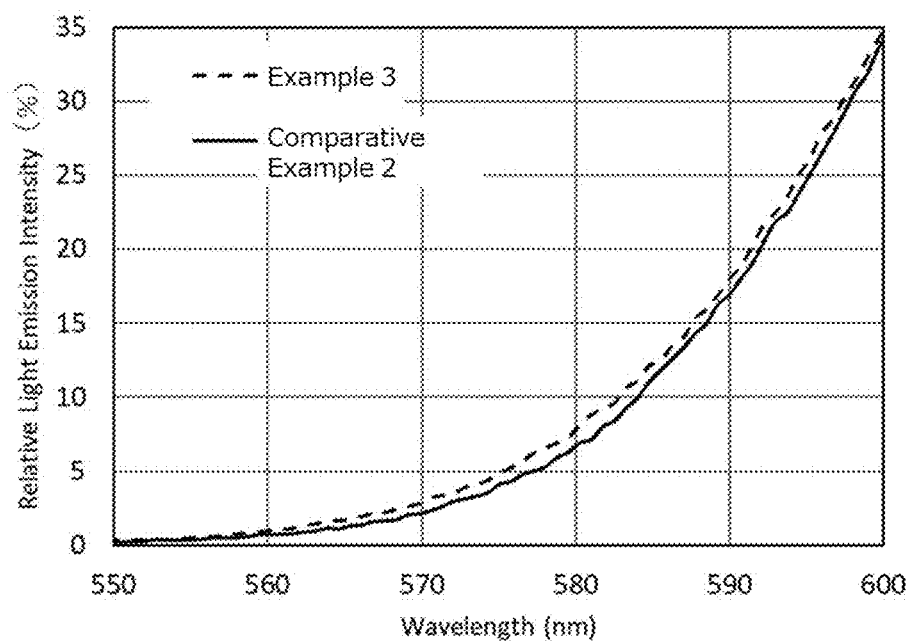
FIG. 9 is a partial enlarged view of the relative light emission spectra of the light emitting device of Example 3 and the light emitting device of Comparative Example 2 in a wavelength range of 550 nm or more and 600 nm or less.

FIG. 9 is a partial enlarged view of the relative light emission spectra of the light emitting device of Example 3 and the light emitting device of Comparative Example 2 in a wavelength range of 550 nm or more and 600 nm or less. In the light emitting device of Example 3 and the light emitting device of Comparative Example 2, the thicknesses of the fluorescent material layers were the substantially the same as each other, but the dielectric multilayer films were different from each other. In the light emission spectrum in a range of 550 nm or more and 600 nm or less, the light emission intensity of the light emitting device of Example 3 was larger than the light emission intensity of the light emitting device of Comparative Example 2. As a result, it is considered that in the light emitting device of Comparative Example 2, the light subjected to the wavelength conversion by the fluorescent material to be transmitted is reflected by the dielectric multilayer film, and the light emission intensity in a range of 550 nm or more and 600 nm or less is decreased. It is considered from the above that in the case in which the light emitting device has a small wavelength difference ΔW of less than 20 nm, the light subjected to the wavelength conversion by the fluorescent material to be transmitted is reflected by the dielectric multilayer film, the reflected light escapes from the dielectric multilayer film by the change in directional angle, and color unevenness occurs by the change in directional angle, resulting in deteriorated directional chromaticity characteristics.

Figure 10:
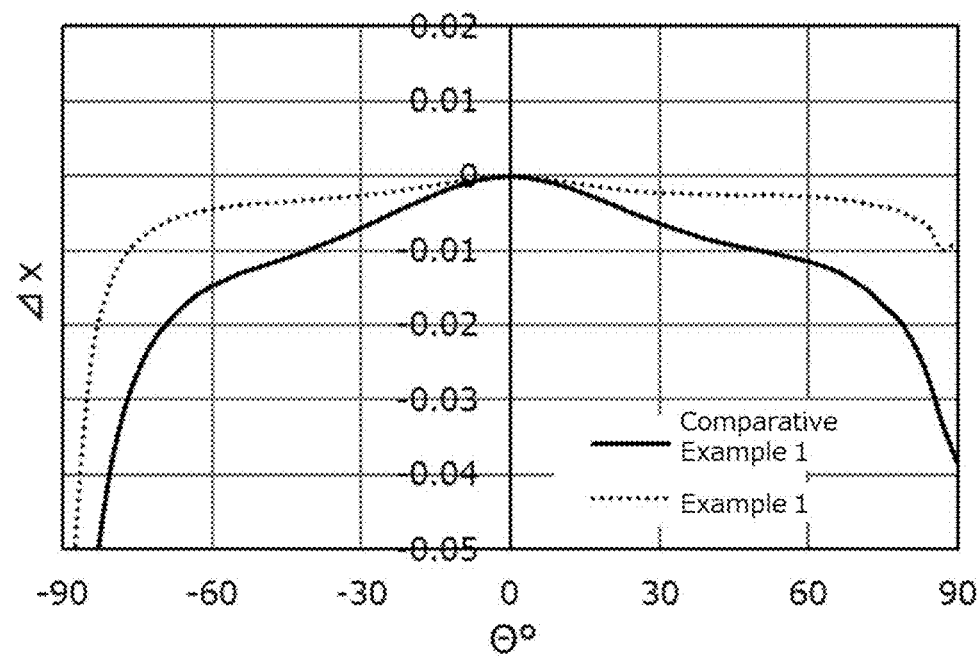
FIG. 10 is a chart showing the directional chromaticity characteristics of the light emitting device of Example 1 and the light emitting device of Comparative Example 1.

FIG. 10 is a chart showing the directional chromaticity characteristics in the xz direction of the light emitting device of Example 1 and the light emitting device of Comparative Example 1. In the range of a directional angle of 0° to −90°, which was not affected by the semiconductor element, the light emitting device of Example 1 had smaller differences Δx of the x coordinate between the x coordinate $x_0$ at a directional angle of 0° and the x coordinates $x_θ$ at directional angles θ than the light emitting device of Comparative Example 1, and thus had smaller color unevenness and better directional chromaticity characteristics than the light emitting device of Comparative Example 1.

Figure 11:
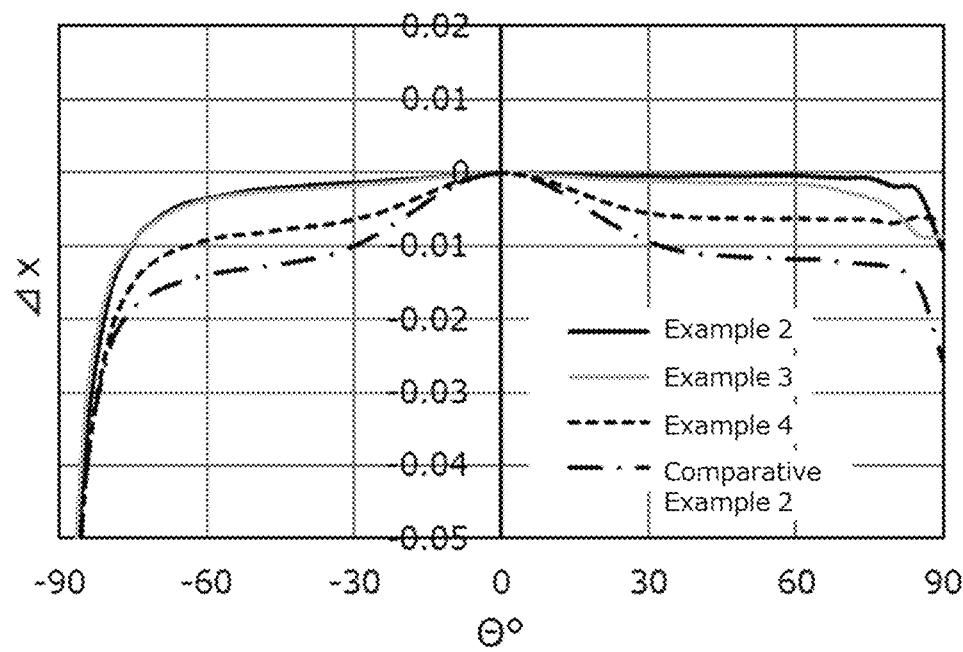
FIG. 11 is a chart showing the directional chromaticity characteristics of the light emitting devices of Examples 2 to 4 and the light emitting device of Comparative Example 2.

FIG. 11 is a chart showing the directional chromaticity characteristics in the xz direction of the light emitting devices of Examples 2 to 4 and the light emitting device of Comparative Example 2. In the range of a directional angle of 0° to −90°, which was not affected by the semiconductor element, the light emitting devices of Examples 2 to 4 had smaller differences Δx of the x coordinate between the x coordinate $x_0$ at a directional angle of 0° and the x coordinates $x_θ$ at directional angles θ than the light emitting device of Comparative Example 2, and thus had smaller color unevenness and better directional chromaticity characteristics than the light emitting device of Comparative Example 2.

The light emitting device according to one embodiment of the present disclosure can be applied to a light emitting device for a general illumination and a light emitting device for a vehicle.

The invention claimed is:

1. A light emitting device comprising:
a light emitting element having a light emission peak wavelength in a range of 380 nm or more and 485 nm or less;
a wavelength conversion member comprising:
a fluorescent material layer disposed on a light emission side of the light emitting element and containing a fluorescent material having a reflectance to light having a wavelength of 450 nm of 10% or less and a light emission peak wavelength in a range of 610 nm or more and 780 nm or less, and
a dielectric multilayer film disposed on a light emission side of the fluorescent material layer, wherein:
the light emitting device has a dominant wavelength in a range of 584 nm or more and 780 nm or less;
in a reflection spectrum of the dielectric multilayer film at an incident angle of 0°, assuming that a maximum reflection intensity in a range of 380 nm or more and 780 nm or less in the reflection spectrum is 100%, the dielectric multilayer film has a reflection intensity of 80% or more in a range of 380 nm or more and 485 nm or less, and has a reflection intensity of 10% or less in a range of 610 nm or more and 780 nm or less, assuming that a light emission intensity of a maximum light emission peak is 100%, the light emitting device has a wavelength difference ΔW of 20 nm or more between a wavelength Wr showing a reflection intensity of 50% in the reflection spectrum of the dielectric multilayer film and a wavelength Wf showing a light emission intensity of 50% on a short wavelength side of the maximum light emission peak in a light emission spectrum of the light emitting device.

2. The light emitting device according to claim 1, wherein the light emitting device is configured to emit light in a region that is demarcated by a first straight line connecting a first point and a second point, a second straight line connecting a second point and a third point, a third straight line connecting a third point and a fourth point, and a fourth straight line connecting a fourth point and a first point, wherein in an xy chromaticity coordinate system of the CIE 1931 chromaticity diagram, the chromaticity coordinate (x,y) is (x=0.522, y=0.449) for the first point, (x=0.538, y=0.461) for the second point, (x=0.735, y=0.265) for the third point, and (x=0.721, y=0.259) for the fourth point.

3. The light emitting device according to claim 1, wherein, where Ie is a light emission peak intensity of the light emitting element and Im is a light emission intensity of the maximum light emission peak in the light emission spectrum of the light emitting device, the light emitting device has an intensity ratio Ie/Im of 1/35 or less.

4. The light emitting device according to claim 1, wherein the light emitting device further comprises a translucent member disposed in contact with a light emission side of the dielectric multilayer film.

5. The light emitting device according to claim 1, wherein the wavelength difference ΔW is 30 nm or more.

6. The light emitting device according to claim 1, wherein the wavelength difference ΔW is in a range of 40 nm or more and 150 nm or less.

7. The light emitting device according to claim 1, wherein the fluorescent material comprises a first nitride fluorescent material containing Ca, Eu, Si, Al, N, and optionally Sr, and having a molar ratio of Eu of 0.01 or more and 0.04 or less, a molar ratio of Si of 0.8 or more and 1.2 or less, and a molar ratio of N of 2.5 or more and 3.5 or less, per 1 mol of the composition.

8. The light emitting device according to claim 7, wherein the first nitride fluorescent material has a composition represented by the following formula (I):

$$Sr_tCa_vEu_wAl_xSi_yN_z \qquad (I)$$

wherein in the formula (I), t, v, w, x, y, and z satisfy $0 \leq t < 1$, $0 < v < 1$, $0.01 < w \leq 0.04$, $t+v+w<1$, $0.80 \leq x \leq 1.2$, $0.80 \leq y \leq 1.2$, and $2.5 \leq z \leq 3.5$.

9. The light emitting device according to claim 1, wherein the light emitting device is configured to emit light that has, in an xy chromaticity coordinate system of the CIE 1931 chromaticity diagram, an absolute value of a difference Δx of an x coordinate of 0.010 or less between an x coordinate $x_0$ of a light emission color of the light emitting device at a directional angle of 0° and an x coordinate $x_{60}$ of a light emission color of the light emitting device at a directional angle of 60°.

* * * * *